(12) United States Patent
Al-Habib

(10) Patent No.: US 11,296,490 B2
(45) Date of Patent: Apr. 5, 2022

(54) GROUND FAULT CONTROL FOR MULTIPLE GROUND PATHS

(71) Applicant: Hitachi Astemo Americas, Inc., Harrodsburg, KY (US)

(72) Inventor: Muaiad Al-Habib, Dearborn Heights, MI (US)

(73) Assignee: HITACHI ASTEMO AMERICAS, INC., Harrodsburg, KY (US)

( * ) Notice: Subject to any disclaimer, the term of this patent is extended or adjusted under 35 U.S.C. 154(b) by 85 days.

(21) Appl. No.: 16/841,742

(22) Filed: Apr. 7, 2020

(65) Prior Publication Data

US 2021/0313790 A1 Oct. 7, 2021

(51) Int. Cl.
*H02H 3/16* (2006.01)
*B60R 16/033* (2006.01)
*B60R 16/02* (2006.01)
*G01R 31/52* (2020.01)

(52) U.S. Cl.
CPC ............ *H02H 3/16* (2013.01); *B60R 16/0207* (2013.01); *B60R 16/033* (2013.01); *G01R 31/52* (2020.01)

(58) Field of Classification Search
CPC ......... H02H 3/16; H02H 3/167; B60R 16/033; B60R 16/0207
See application file for complete search history.

(56) References Cited

U.S. PATENT DOCUMENTS

| | | | |
|---|---|---|---|
| 2014/0239713 A1* | 8/2014 | Kanzaki | H02H 11/002 307/11 |
| 2019/0109479 A1* | 4/2019 | Tsujioka | B60R 16/03 |
| 2020/0271722 A1* | 8/2020 | van Oevelen | G01R 31/2621 |
| 2021/0046973 A1* | 2/2021 | Koseki | B62D 5/0403 |

\* cited by examiner

*Primary Examiner* — Sisay G Tiku
(74) *Attorney, Agent, or Firm* — Mattingly & Malur, PC

(57) ABSTRACT

In some examples, an ECU includes a microcontroller, a first load switch, a first amplifier, a first control circuit, and an internal ground connected to an external ground. The first load switch is operable to connect and disconnect the ECU from a first ground path to the external ground. The first amplifier is operable to sense a current flow relative to the first ground path. The first control circuit is operable to receive an output from the first amplifier and to control the first load switch. When the ECU is non-operational and the microcontroller is in an OFF state, the first amplifier is operable to sense current indicative of a ground fault occurring relative to the first ground path. In response, the first amplifier outputs a signal which causes the first load switch to disconnect the internal ground from the first ground path.

16 Claims, 17 Drawing Sheets

GROUND FAULT CONTROL FOR MULTIPLE GROUND PATHS

BACKGROUND

In automotive systems, one or more wire harnesses are employed to facilitate electrical power distribution to electrical components and systems of a vehicle. Wire harnesses may provide power distribution from a vehicle battery to one or more electronic control units (ECUs). Wire harnesses may also provide electrical grounding to one or more ECUs by having a terminal connection to a vehicle chassis, such as being bolted to the vehicle chassis.

SUMMARY

In some implementations, an electronic control unit (ECU) includes an internal ground, a microcontroller, a first load switch, a first amplifier, and a first control circuit. The internal ground of the ECU is also connected to an external ground via a first ground path from the ECU to the external ground and a second ground path from the ECU to the external ground. The first load switch is operable to connect and disconnect the ECU from the first ground path. The first amplifier is operable to sense a current flow at a side of the first load switch connected to the first ground path. The first control circuit is operable to receive an output from the first amplifier and to drive the first load switch on the basis of the output from the first amplifier. When the ECU is non-operational and the microcontroller is in an OFF state, the first amplifier is operable to sense a current which is indicative of a ground fault having occurred relative to the first ground path. In response to sensing the ground fault current, the first amplifier outputs a signal which causes the first control circuit to control the first load switch to disconnect the internal ground of the ECU from the first ground path.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
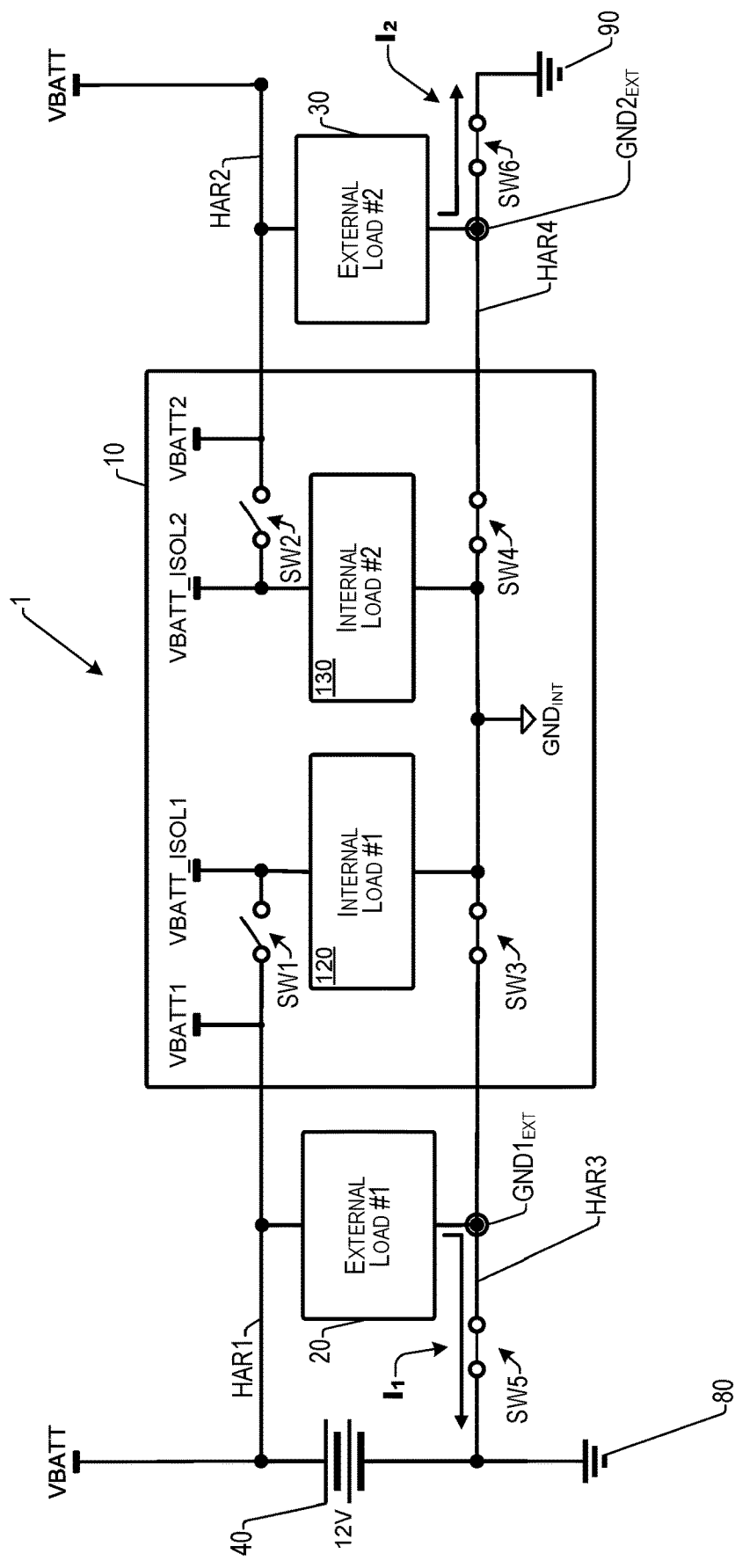
FIG. 1 illustrates a first example of multiple components having shared wiring harnesses according to some implementations.

The technology herein includes arrangements and techniques for protecting an electronic control unit (also referred to as an "ECU" in some examples) which has multiple shared wiring harnesses, such as an ECU of a safety critical system of an automotive vehicle such as autonomous drive (AD) systems, advanced driver assistance systems (ADAS), or the like, by isolating the ECU from a battery and also isolating the ECU from external loads. Many ECUs, such as those in the safety critical systems of the vehicle, may be required to have at least dual battery connections and at least dual main ground paths in order to provide redundancy. In systems where an ECU has dual main ground paths to a main ground, such as a vehicle chassis, there is a problem that the occurrence of a ground fault in one of the dual ground paths causes undesired current flow from other loads into the ECU due to the loss of connection to the vehicle chassis. This undesirable current can flow through the ECU along a shared wire harness in the direction of the other one of the dual ground paths in which a ground fault has not occurred. Due to design and manufacturing constraints, wire harnesses and ECUs have limited current ratings. The examples herein provide ground fault protection to prevent undesirable current flow through a ground path into an ECU, which can prevent permanent damage to the ECU and lower the risk of a fire hazard when a ground fault occurs.

In implementations herein, an ECU may be configured to connect to a battery via multiple paths provided by multiple wiring harnesses. In implementations herein, an ECU may be configured to connect to a main ground, such as a vehicle frame, via multiple paths provided by multiple wiring harnesses. Further, the ECU may share one such wiring harness with one or more other electrical loads which may be sensors, other ECUs, and other components which may need to be connected to the main ground. In other words, a single wire harness may provide a shared ground return path to the vehicle chassis to multiple loads. In such arrangements, there is a concern that a ground fault will occur during the useful life of the vehicle. For example, poor electrical connection of the wire harness to the vehicle chassis for any reason, such as from poor connection of the wire harness to the vehicle due to physical separation, rust, contamination, etc., can lead to the occurrence of a ground fault. Circuitry may be provided externally to the ECU or integrated within the ECU to provide ground fault sensing and protection control with respect to at least one ground path to the main ground when the ECU is in a non-operational state. In some examples, the circuitry may provide ground fault sensing and protection control with respect to at least one ground path to the main ground when the ECU is in an operational state. In some examples, a microcontroller provided externally to the ECU or a microcontroller of the ECU may provide additional ground fault sensing and protection control when the ECU is in an operational state.

In some examples, circuitry may be provided externally to the ECU or integrated with the ECU to isolate the ECU from a battery which powers the ECU. For discussion purposes, some examples are described in the environment of a vehicle. However, implementations herein are not limited to the particular examples provided, and may be extended to other service environments and also other types of batteries as will be apparent to those of skill in the art in light of the disclosure herein.

Some implementations include arrangements and techniques for at least partially preventing undesirable current flow through an ECU towards a vehicle chassis providing a ground to the ECU by sensing and disconnecting the ECU from the particular ground path in which the ground fault has occurred. Some implementations include arrangements having current sensing and control circuitry for each ground path provided to an ECU. For instance, for each of the dual main ground paths, a bidirectional load switch circuit is arranged between the respective main ground path providing external grounding to a vehicle chassis and an internal ground node used within the ECU and current sensing circuitry is arranged to measure currents relative to the respective main ground path and the internal ground node. Using the measured currents, when a fault occurs causing one of the main ground paths from the ECU to the vehicle chassis to be interrupted, control circuitry provides switching control to the load switch to stop undesirable current flow into the ECU from the faulted main ground path.

Some implementations include arrangements and techniques for isolating a battery providing power to the ECU and for reverse battery protection. For instance, for each of the dual battery connections, battery isolation and reverse battery protection circuitry is arranged between the battery and the bidirectional load switch. Further, the battery isolation and reverse battery protection circuitry is arranged between the battery and the current sensing circuitry. In this manner, the battery isolation and reverse battery protection circuitry generates the necessary voltages used by the bidirectional load switch, the current sensing circuitry. In some implementations, the battery isolation and battery protection circuitry may also generate the necessary voltages used by the ECU itself.

FIG. 1 illustrates a first example of multiple components having shared wiring harnesses according to some implementations. In this example, an electrical system 1 includes an ECU 10 connected by a first wiring harness HAR1 to a battery 40, which may be a 12 V automotive battery. The ECU 10 is also connected by a second wiring harness HAR2 to the battery 40. In the illustrated example, the wiring harnesses HAR1 and HAR2 provide dual connections to the battery 40 so that the ECU 10 receives a battery voltage VBATT via the first wiring harness HAR1 and also separately receives the battery voltage VBATT via the second wiring harness HAR2. The ECU 10 is also connected by a third wiring harness HAR3 to a first main ground 80. The ECU 10 is also connected by a fourth wiring harness HAR4 to a second main ground 90. In the illustrated example, the wiring harnesses HAR3 and HAR4 provide dual connections to a main ground plane of a vehicle so that the ECU 10 has a first ground path via the third wiring harness HAR3 to the first main ground 80 of the vehicle and also separately has a second ground path via the fourth wiring harness HAR4 to the second main ground 90. The main grounds 80 and 90 may be provided at different locations, such as different locations on a chassis of the vehicle such as to provide a redundant connection to ground, or alternatively, may be provided at a same location on the chassis in other examples.

Within the ECU 10, the battery voltage VBATT may be provided by the first wiring harness as a first battery voltage VBATT1 and the battery voltage VBATT may also be provided by the second wiring harness as a second battery voltage VBATT1. A first reverse battery protection circuit, represented as a switch SW1, may be provided to receive the first battery voltage VBATT1 and generate a first isolated battery voltage VBATT_ISOL1 which is provided to a first internal load 120 of the ECU 10. A second reverse battery protection circuit, represented as a switch SW2, may be provided to receive the second battery voltage VBATT2 and generate a second isolated battery voltage VBATT_ISOL2 which is provided to at least one of the first and second internal loads 120, 130 of the ECU 10. In this manner, the wiring harnesses HAR1 and HAR2 provide dual connections between the ECU 10 and the battery 40.

An open state of either of the switches SW1 or SW2 is used to illustrate that the ECU 10 is in a non-operational state. A closed state of either the switches SW1 or SW2 is used to illustrate that the ECU 10 is in an operational state. Details of the first reverse battery protection and the second reverse battery protection circuits will be described later.

Further within the ECU, the first internal load 120 and the second internal load 130 may be connected to an internal ground $GND_{INT}$ of the ECU 10. The internal ground $GND_{INT}$ may be further connected to the first main ground 80 by the third wiring harness HAR3 as a first main ground path. The internal ground $GND_{INT}$ may be further connected to the second main ground 90 by the fourth wiring harness HAR4 as a second main ground path. In this manner, the wiring harnesses HAR3 and HAR4 provide dual ground paths between the ECU 10 and the main grounds 80, 90 of the vehicle which may be, for instance, the vehicle chassis. A first protection and sensing circuitry, represented by SW3, may be provided between the third wiring harness HAR3 and the internal ground $GND_{INT}$ to protect the ECU 10 from a ground fault along the electrical path to the first main ground 80. A second protection and sensing circuitry, represented by SW4, may be provided between the fourth wiring harness HAR4 and the internal ground $GND_{INT}$ to protect the ECU from a ground fault along the electrical path to the first main ground 80.

An open state of the switch SW3 is used to illustrate that the ECU 10 is in a protected state with respect to the first main ground 80. A closed state of the switch SW3 is used to illustrate that the ECU 10 is in a connected state with respect to the first main ground 80. An open state of the switch SW4 is used to illustrate that the ECU 10 is in a protected state with respect to the second main ground 90. A closed state of the switch SW4 is used to illustrate that the ECU 10 is in a connected state with respect to the second main ground 90. Details of the first protection and sensing circuitry as well as the second protection and sensing circuitry will be described later.

As illustrated in FIG. 1, a switch SW5 is provided between the first external load 20 and the first main ground 80. A closed state of the switch SW5 is used to illustrate a normal state of the ground path between the first external load 20 and the first main ground 80 where a current $I_1$ is able to flow from the first external load 20 to the first main ground 80. An open state of the switch SW5 is used to illustrate that the ground path between the first external load 20 and the first main ground 80 has been interrupted leading to a situation where a ground fault may occur with respect to the third wiring harness HAR3 and the ECU 10. A switch SW6 is provided between the second external load 30 and the second main ground 90. A closed state of the switch SW5 is used to illustrate a normal state of the ground path between the second external load 30 and the second main ground 90 where a current $I_2$ is able to flow from the second external load 30 to the second main ground 90. An open state of the switch SW5 is used to illustrate that the ground path between the second external load 30 and the second main ground 90 has been interrupted leading to a situation where a ground fault may occur with respect to the fourth wiring harness HAR4 and the ECU 10.

As explained above, FIG. 1 illustrates the situation where the ECU is in the non-operational state (e.g., OFF state) as indicated by the switches SW1 and SW2 being in the open state, and the electrical system 1 is in a normal state as indicated by the switches SW5 and SW6 being in the closed state indicating that no ground fault has occurred. Accordingly, current $I_1$ from the first external load 20 flows through the third ground path provided by the third wiring harness HAR3 to the first main ground 80. Similarly, current $I_2$ from the second external load 30 flows through the fourth ground path provided by the fourth wiring harness HAR4 to the second main ground 90. In addition, the internal ground $GND_{INT}$ of the ECU 10 is connected to by the third wiring harness HAR3 to the first main ground 80 and the by the fourth wiring harness HAR4 to the second main ground 90. In this example, the ECU 10 is provided with dual main ground paths to the main grounds 80 and 90 which may represent the same or different grounding points for the electrical system 1.

Figure 2:
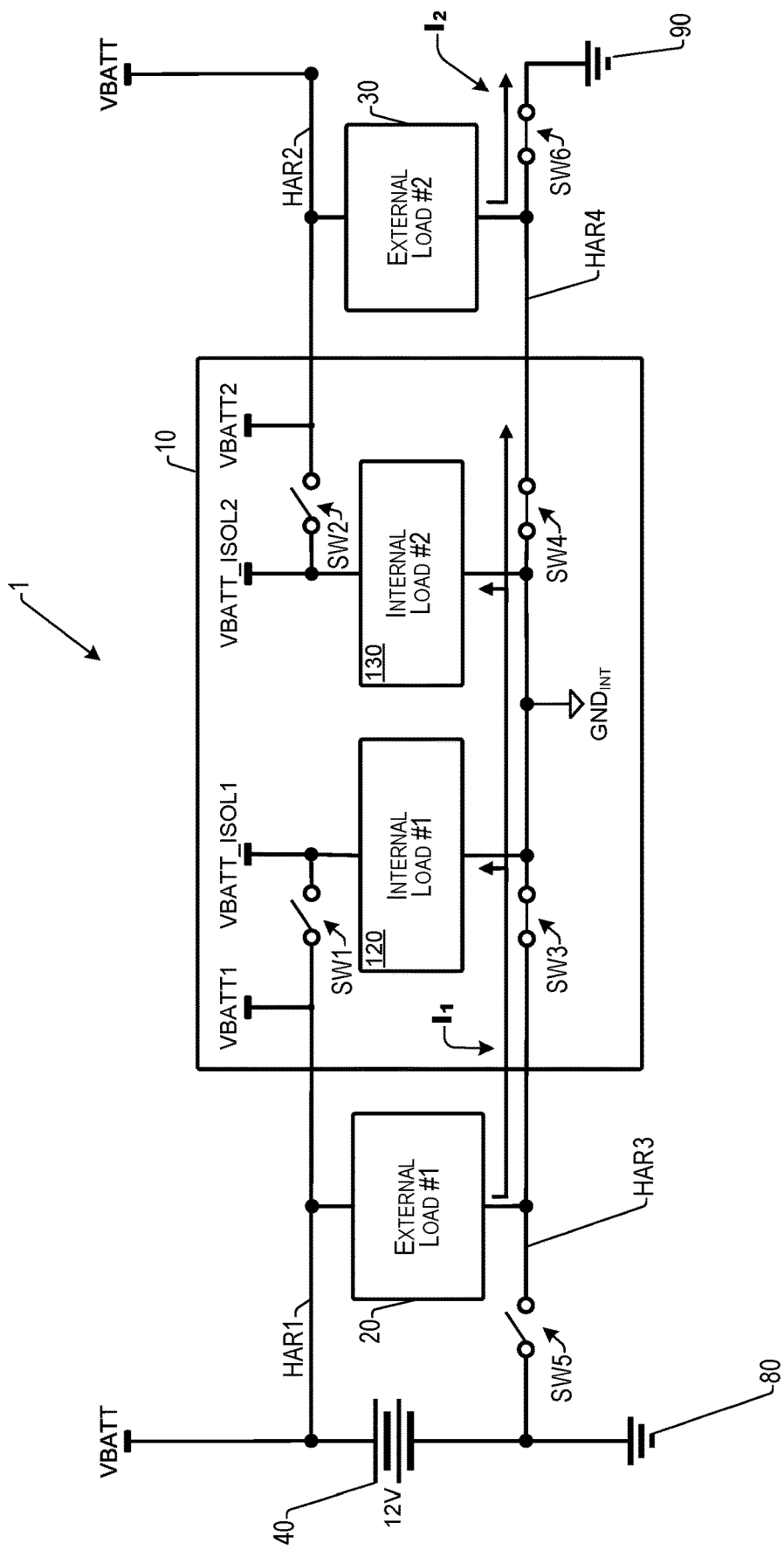
FIG. 2 illustrates the first example of multiple components having shared wiring harnesses in which a ground fault occurs according to some implementations.

FIG. 2 illustrates the electrical system 1 in a situation where the ECU 10 is in the non-operational state (e.g., OFF state) and a ground fault has occurred, as indicated by the switch SW5 being in the open state, such as when the third wiring harness HAR3 is disconnected from the first main ground 80. Due to the occurrence of the ground fault, the first external load 20 no longer has an electrical connection to the first main ground 80 and the current $I_1$ from the first external load 20 flows through the third wiring harness HAR3 towards the ECU 10 and the second main ground 90. A problem can occur when the current $I_1$ from the first external load 20 flows into the third wiring harness HAR3, enters the ECU 10 and flows into one or more of the first internal load 120 and the second internal load 130 causing damage to one or more of the first internal load 120 and the second internal load 130. In such circumstances, a first protection and sensing circuitry are operable to sense the current $I_1$ from the first external load 20 entering the ECU 10 and electrically disconnect the internal ground $GND_{INT}$ of the ECU 10 from the third wiring harness HAR3. By electrically disconnecting the internal ground $GND_{INT}$ of the ECU 10 from the third wiring harness HAR3, components of the ECU 10, such as the first internal load 120 and the second internal load 130, are protected from the ground fault causing external current flowing in the third wiring harness HAR3 and damage to the components of the ECU 10 can be prevented while the ECU 10 is in the non-operational state (e.g., OFF state).

Figure 3:
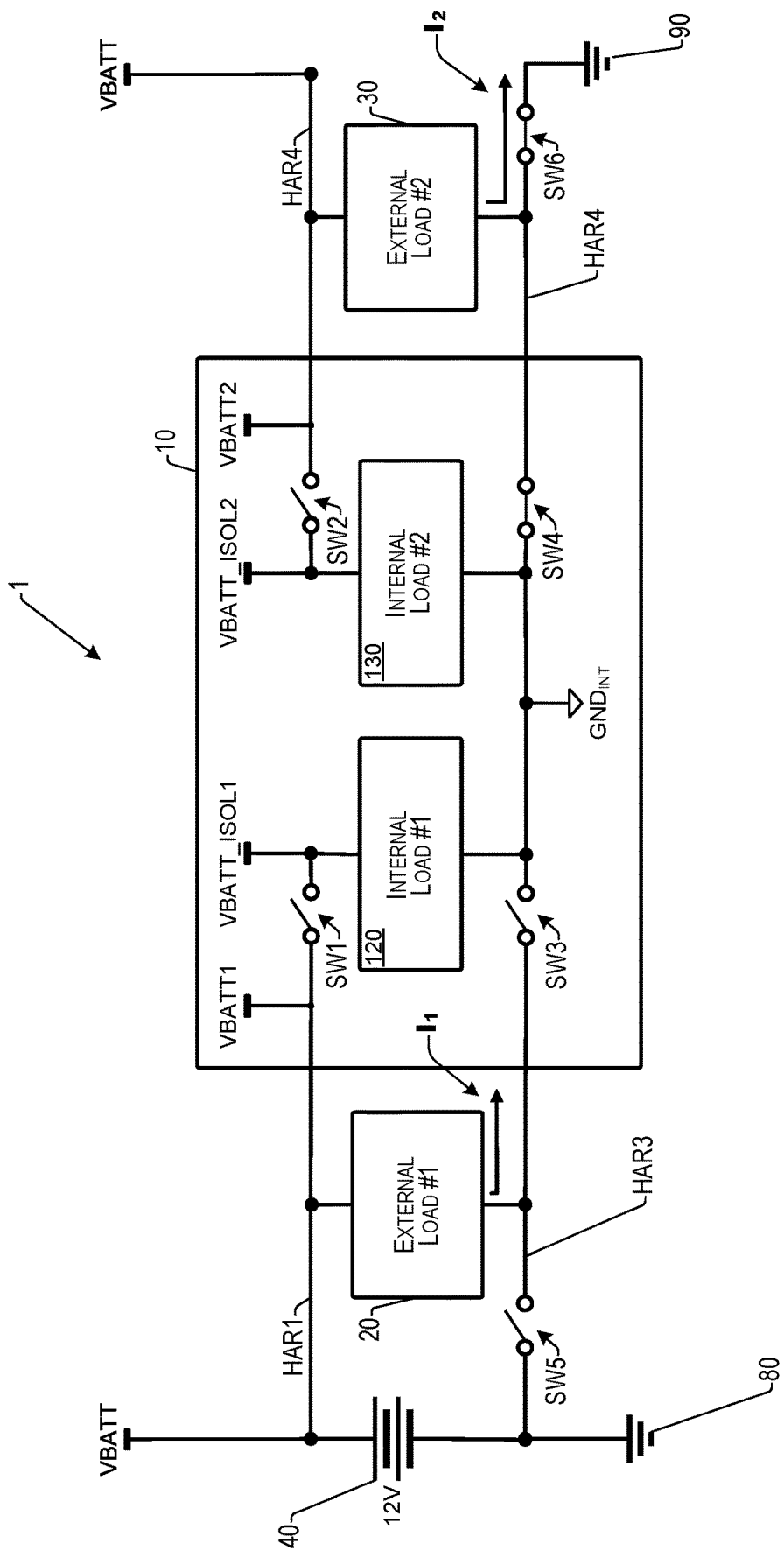
FIG. 3 illustrates the first example of multiple components having shared wiring harnesses in which external current flow is prevented according to some implementations.

FIG. 3 illustrates the electrical system 1 in a situation where the ECU 10 is in the non-operational state (e.g., OFF state) and the first protection and sensing circuitry electrically disconnect the internal ground $GND_{INT}$ of the ECU 10 from the third wiring harness HAR3. In FIG. 3, electrically disconnecting the internal ground $GND_{INT}$ of the ECU 10 from the third wiring harness HAR3 is illustrated for purposes of explanation as the switch SW3 being in the open state.

It should be appreciated by those skilled in the art that a similar situation exists with respect to where the ECU 10 is in the non-operational state (e.g., OFF state) and a ground fault has occurred, corresponding to the switch SW6 being in the open state, such as when the fourth wiring harness HAR4 is disconnected from the second main ground 90. The second protection and sensing circuitry are operable to electrically disconnect the internal ground $GND_{INT}$ of the ECU 10 from the fourth wiring harness HAR4. By electrically disconnecting the internal ground $GND_{INT}$ of the ECU 10 from the fourth wiring harness HAR4, components of the ECU 10, such as the first internal load 120 and the second internal load 130, are similarly protected from a ground fault causing external current flowing from the second external load 30 into the fourth wiring harness HAR4 towards the ECU 10 and damage to the components of the ECU 10 can be prevented while the ECU 10 is in the non-operational state (e.g., OFF state).

Figure 4:
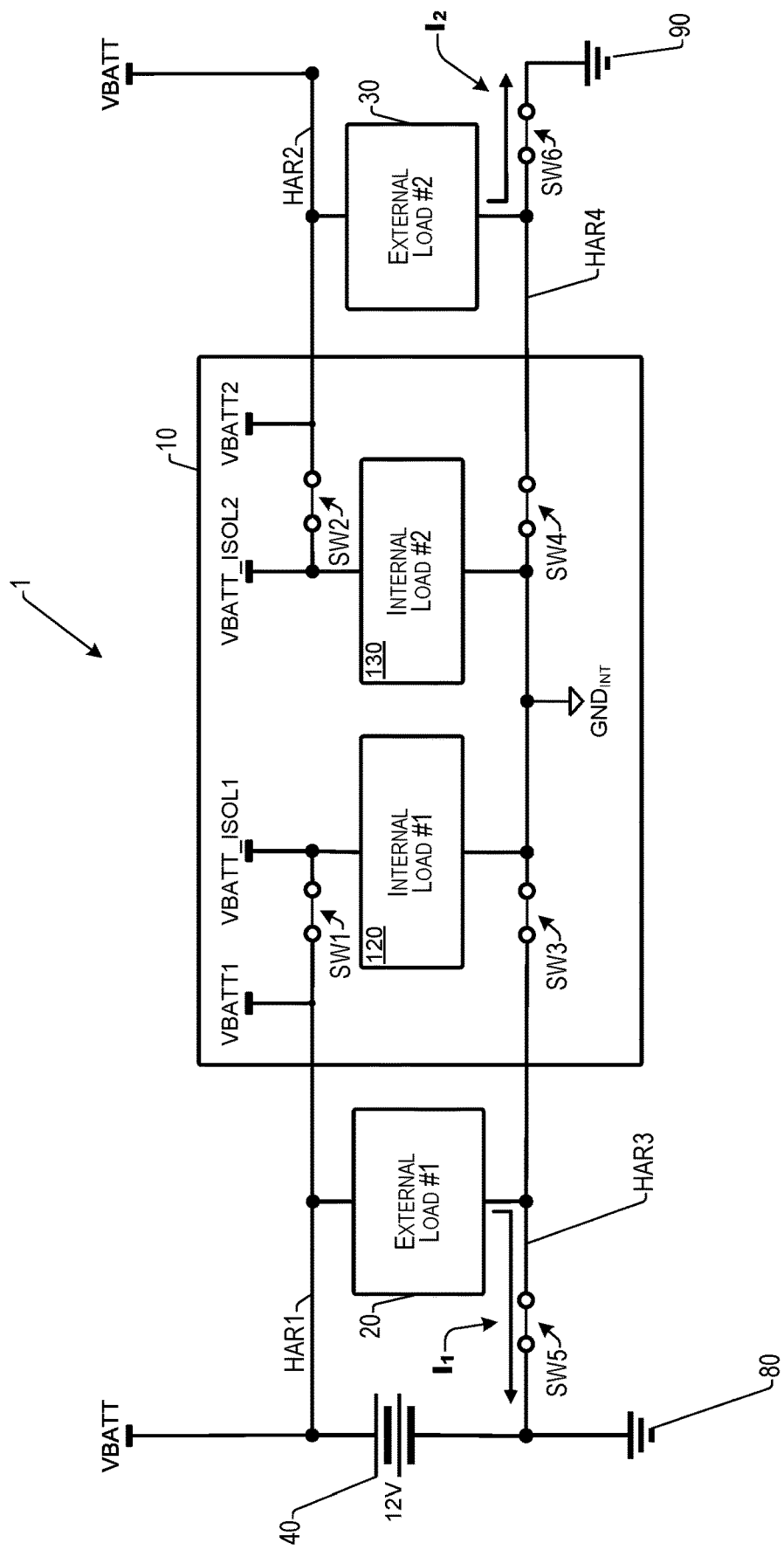
FIG. 4 illustrates a second example configuration of multiple components having shared wiring harnesses according to some implementations.

FIG. 4 illustrates a situation where the ECU is in an operational state (e.g., ON state) as indicated by the switches SW1 and SW2 being in the closed state, and the electrical system 1 is in a normal state as indicated by the switches SW5 and SW6 being in the closed state indicating that no ground fault has occurred. Accordingly, current $I_1$ from the first external load 20 flows through the third ground path provided by the third wiring harness HAR3 to the first main ground 80. Similarly, current $I_2$ from the second external load 30 flows through the fourth ground path provided by the fourth wiring harness HAR4 to the second main ground 90. In addition, the internal ground $GND_{INT}$ of the ECU 10 is connected to by the third wiring harness HAR3 to the first main ground 80 and the by the fourth wiring harness HAR4 to the second main ground 90.

Figure 5:
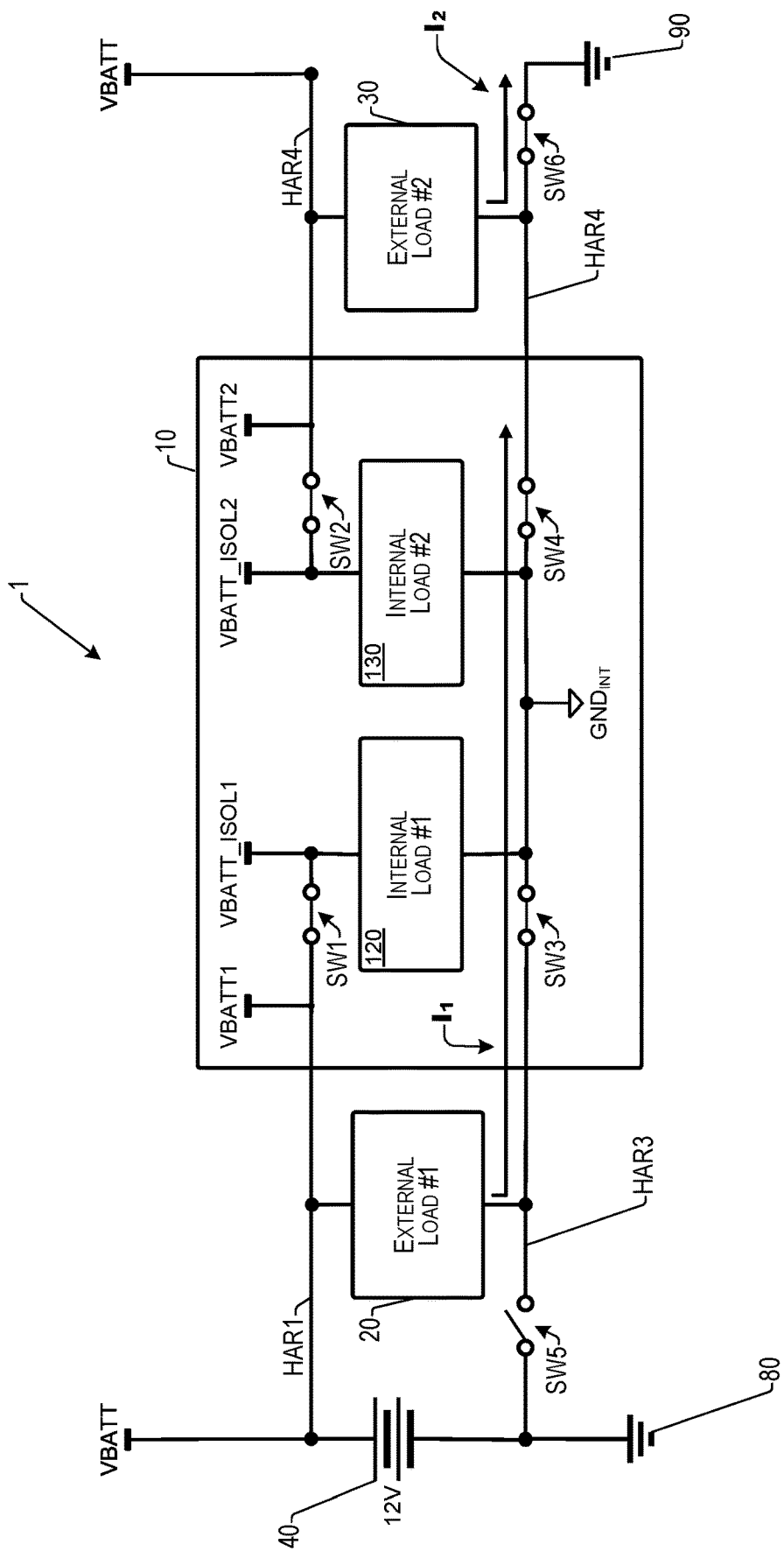
FIG. 5 illustrates the second example of multiple components having shared wiring harnesses in which a ground fault occurs according to some implementations.

FIG. 5 illustrates the electrical system 1 in a situation where the ECU 10 is in the operational state (e.g., ON state) and a ground fault has occurred, as indicated by the switch SW5 being in the open state, such as when the third wiring harness HAR3 is disconnected from the first main ground 80. Due to the occurrence of the ground fault, the first external load 20 no longer has an electrical connection to the first main ground 80 and the current $I_1$ from the first external load 20 flows through the third wiring harness HAR3 towards the ECU 10 and the second main ground 90. A problem can occur when the current $I_1$ from the first external load 20 flows into the third wiring harness HAR3, enters the ECU 10 and flows into one or more of the first internal load 120 and the second internal load 130 causing damage to one or more of the first internal load 120 and the second internal load 130. In such circumstances, a first protection and sensing circuitry are operable to sense the current $I_1$ from the first external load 20 entering the ECU 10 and electrically disconnect the internal ground $GND_{INT}$ of the ECU 10 from the third wiring harness HAR3. Further, when the ECU 10 is in the operational state, a microcontroller to be described later is operable to be connected to the first protection and sensing circuitry and to also electrically disconnect the internal ground $GND_{INT}$ of the ECU 10 from the third wiring harness HAR3 in situations where the sensed current $I_1$ is below a predetermined level. By electrically disconnecting the internal ground $GND_{INT}$ of the ECU 10 from the third wiring harness HAR3, components of the ECU 10, such as the first internal load 120 and the second internal load 130, are protected from the ground fault causing external current flowing in the third wiring harness HAR3 and damage to the components of the ECU 10 can be prevented while the ECU 10 is in the operational state (e.g., ON state).

Figure 6:
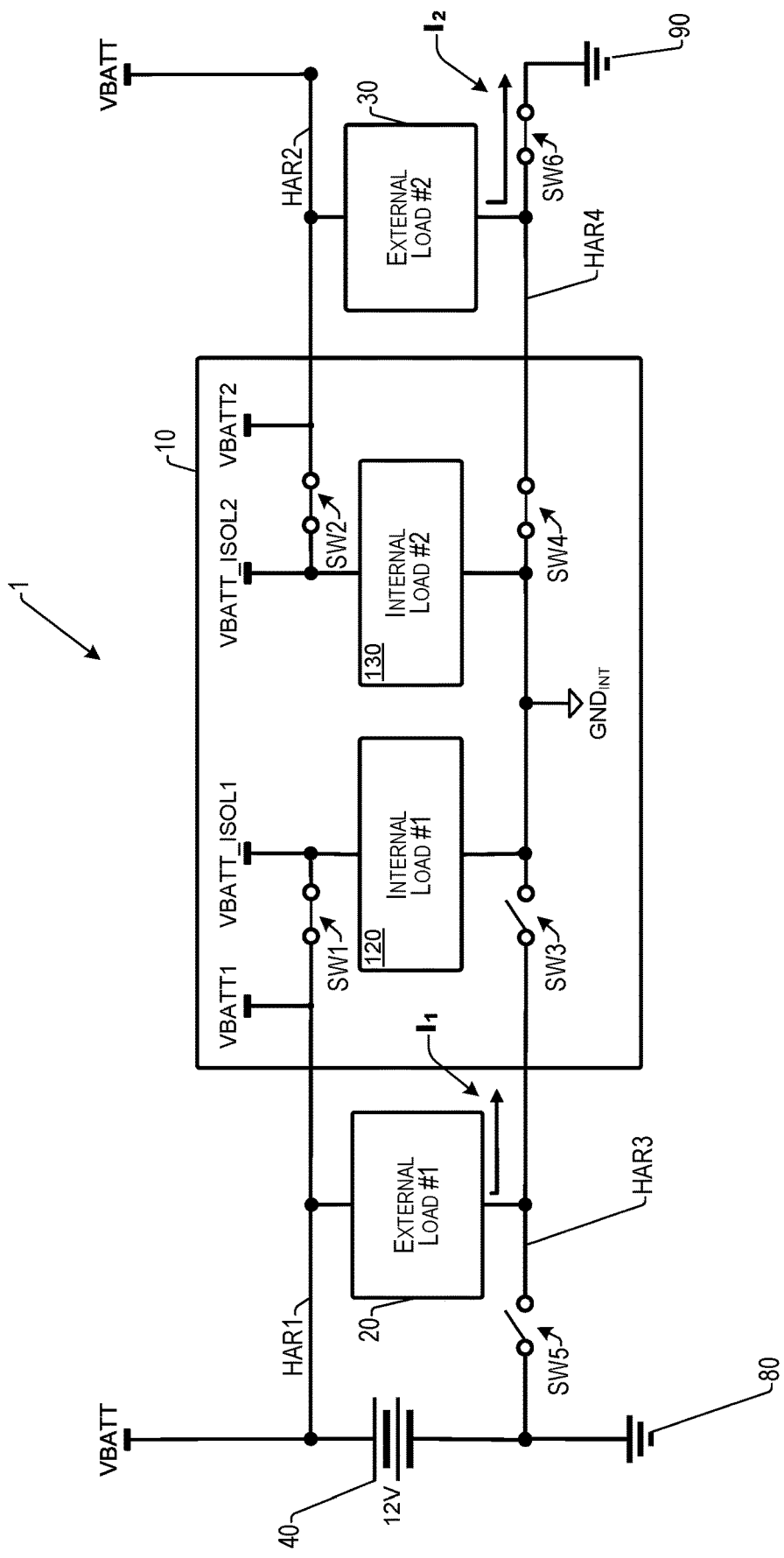
FIG. 6 illustrates the second example of multiple components having shared wiring harnesses in which external current flow is prevented according to some implementations.

FIG. 6 illustrates the electrical system 1 in a situation where the ECU 10 is in the operational state (e.g., ON state) and the internal ground $GND_{INT}$ of the ECU 10 has been electrically disconnected from the third wiring harness HAR3. In FIG. 6, electrically disconnecting the internal ground $GND_{INT}$ of the ECU 10 from the third wiring harness HAR3 is illustrated for purposes of explanation as the switch SW3 being in the open state similar to FIG. 3.

It should be appreciated by those skilled in the art that a similar situation exists with respect to where the ECU 10 is in the operational state (e.g., ON state) and a ground fault has occurred, corresponding to the switch SW6 being in the open state, such as when the fourth wiring harness HAR4 is disconnected from the second main ground 90. A second protection and second sensing circuitry are operable to electrically disconnect the internal ground $GND_{INT}$ of the ECU 10 from the fourth wiring harness HAR4. Further, the microcontroller to be described later is operable to be connected to the second protection and sensing circuitry and to also electrically disconnect the internal ground $GND_{INT}$ of the ECU 10 from the fourth wiring harness HAR4 in situations where the sensed current $I_2$ is below a predetermined level. By electrically disconnecting the internal ground $GND_{INT}$ of the ECU 10 from the fourth wiring harness HAR4, components of the ECU 10, such as the first internal load 120 and the second internal load 130, are similarly protected from a ground fault causing external current flowing from the second external load 30 into the fourth wiring harness HAR4 towards the ECU 10 and damage to the components of the ECU 10 can be prevented while the ECU 10 is in the operational state (e.g., ON state).

Figure 7:
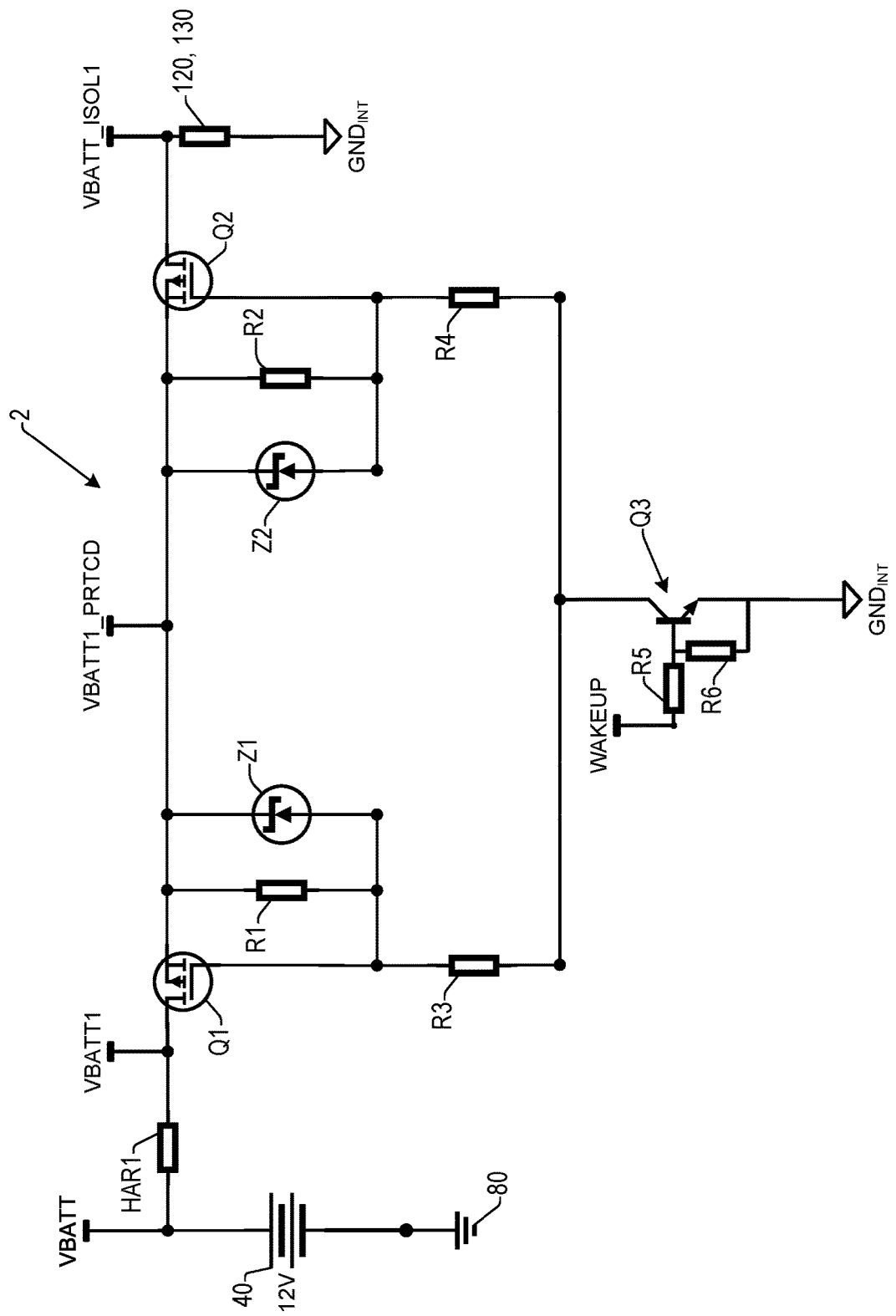
FIG. 7 illustrates an example of a first reverse battery protection circuit and a first wiring harness connected to a battery according to some implementations.

FIG. 7 illustrates an example of the first reverse battery protection and the first wiring harness connected to the battery according to some implementations.

In FIG. 7, the first wiring harness HAR1 connects the battery 40 to the first reverse battery protection circuit 2. The battery voltage VBATT may be provided by the first wiring harness as a first battery voltage VBATT1. In the first reverse battery protection circuit 2, a first p-type metal oxide semiconductor field effect transistor (pMOSFET) Q1 and a second pMOSFET Q2 are connected to each other in a common source configuration to provide an electrical path from the first wiring harness HAR1 to the first internal load 120 and/or the second internal load 130. A first resistance R1 and a first zener diode Z1 are connected between a source and a gate of the first MOSFET Q1. A second resistance R2 and a second zener diode Z2 are connected between a source and a gate of the second MOSFET Q2. The gate of the first MOSFET Q1 is further connected by a third resistance R3 to a collector of a third transistor Q3, which may be a bipolar junction transistor (BJT). The gate of the second MOSFET Q2 is further connected by a fourth resistance R4 to the collector of the third transistor Q3. A base of the third transistor Q3 is connected to a fifth resistance R5 to receive a digital wakeup signal WAKEUP. The base of the third transistor Q3 is further connected to an emitter of the third transistor Q3 by a sixth resistance R6. The emitter of the third transistor Q3 may be further connected to the internal ground $GND_{INT}$ of the ECU 10. A voltage level of the wakeup signal WAKEUP controls whether the ECU 10 is in the OFF state or in the ON state.

When the voltage level of the wakeup signal WAKEUP is low, the first and second resistances R1, R2 act to pull up the gates of the first and second MOSFETs Q1 and Q2 to the battery voltage. In turn, the first and second MOSFETs Q1 and Q2 will be in an OFF state and power from the battery 40 will not be supplied to the first internal load 120 and the second internal load 130 of the ECU 10. Hence, the ECU 10 will be in the non-operational state (e.g., OFF state). When the voltage level of the wakeup signal WAKEUP is high, the first and second resistances R1, R2 act to pull down the gates of the first and second MOSFETs Q1 and Q2. In turn, the first and second MOSFETs Q1 and Q2 will be in an ON state and power from the battery 40 will be supplied to one or more of the first internal load 120 and the second internal load 130 of the ECU 10 as the first isolated battery voltage VBATT_ISOL1. Hence, the ECU 10 will be in the operational state (e.g., ON state). Further, a first protection voltage VBATT1_PRTCD is generated between the first and second MOSFETs Q1 and Q2 and will be described in greater detail later.

Figure 8:
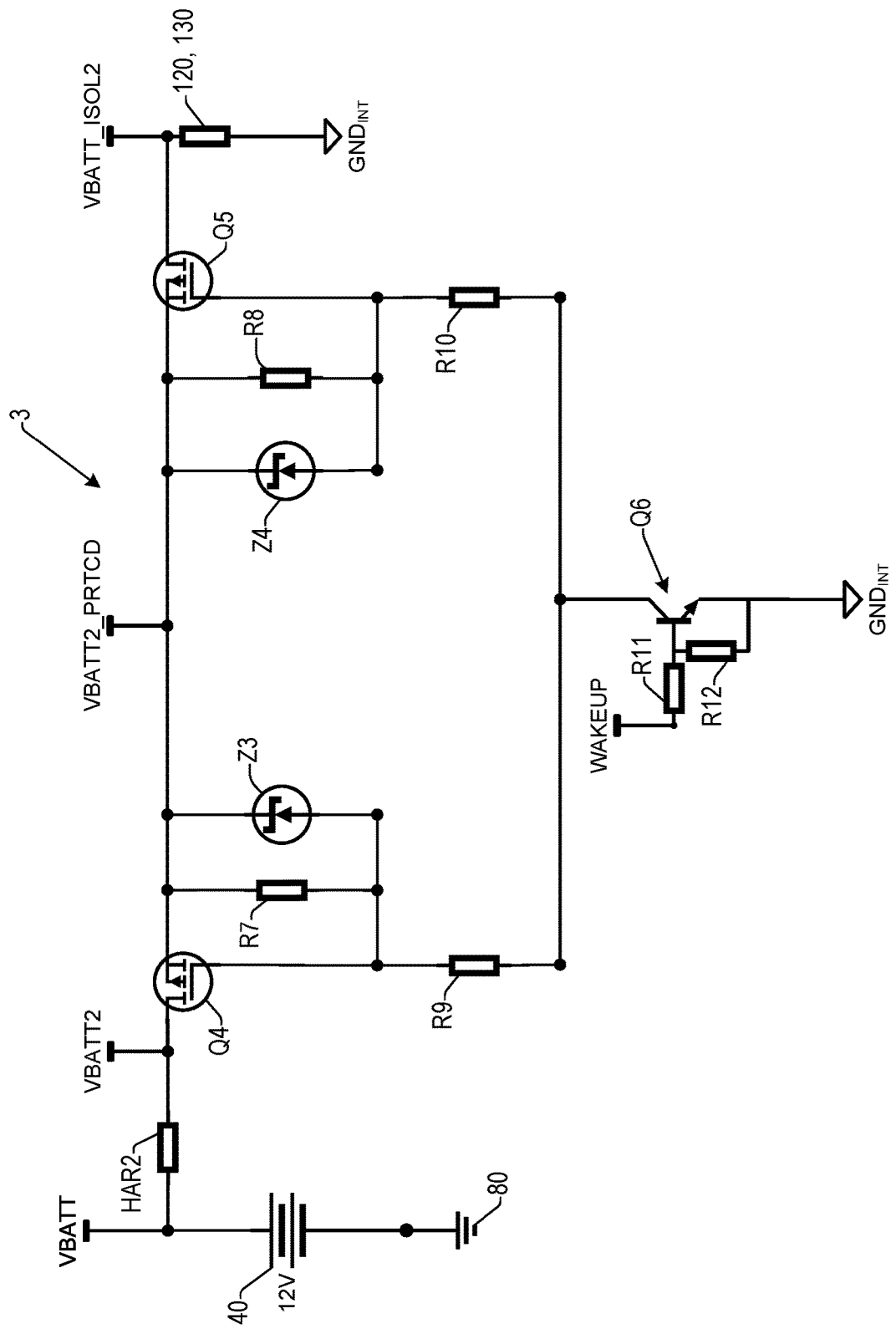
FIG. 8 illustrates an example of a second reverse battery protection circuit and a second wiring harness connected to a battery according to some implementations.

FIG. 8 illustrates an example of the second battery reverse battery protection and the second wiring harness connected to the battery according to some implementations.

In FIG. 8, the second wiring harness HAR2 connects the battery 40 to the second reverse battery protection circuit 3. The second reverse battery protection circuit 3 has a similar configuration to the first reverse battery protection circuit 2. The battery voltage VBATT may be provided by the second wiring harness as a second battery voltage VBATT2. In the second reverse battery protection circuit 3, a fourth pMOSFET Q4 and a fifth pMOSFET Q5 are connected to each other in a common source configuration to provide an electrical path from the second wiring harness HAR2 to the first internal load 120 and/or the second internal load 130. A seventh resistance R7 and a third zener diode Z3 are connected between a source and a gate of the fourth MOSFET Q4. An eighth resistance R8 and a fourth zener diode Z4 are connected between a source and a gate of the fifth MOSFET Q5. The gate of the fourth MOSFET Q4 is further connected by a ninth resistance R9 to a collector of a sixth transistor Q6, which may be a BJT similar to the third transistor Q3. The gate of the fifth MOSFET Q5 is further connected by a tenth resistance R10 to the collector of the sixth transistor Q6. A base of the sixth transistor Q6 is connected to an eleventh resistance R11 to also receive the digital wakeup signal WAKEUP. The base of the sixth transistor Q6 is further connected to an emitter of the sixth transistor Q6 by a twelfth resistance R12. The emitter of the sixth transistor Q6 may be further connected to the internal ground $GND_{INT}$ of the ECU 10.

When the voltage level of the wakeup signal WAKEUP is low, the resistances R7, R8 act to pull up the gates of the fourth and fifth MOSFETs Q4 and Q5 to the battery voltage. In turn, the fourth and fifth MOSFETs Q4 and Q5 will be in an OFF state and power from the battery 40 will not be supplied to the first internal load 120 and the second internal load 130 of the ECU 10. Hence, the ECU 10 will be in the non-operational state (e.g., OFF state). When the voltage level of the wakeup signal WAKEUP is high, the resistances R7, R8 act to pull down the gates of the fourth and fifth MOSFETs Q4 and Q5. In turn, the fourth and fifth MOSFETs Q4 and Q5 will be in an ON state and power from the battery 40 will be supplied to one or more of the first internal load 120 and the second internal load 130 of the ECU 10 as the second isolated battery voltage VBATT_ISOL2. Hence, the ECU 10 will be in the operational state (e.g., ON state). Further, a second protection voltage VBATT2_PRTCD is generated between the fourth and fifth MOSFETs Q4 and Q5 and will be described in greater detail later.

Figure 9:
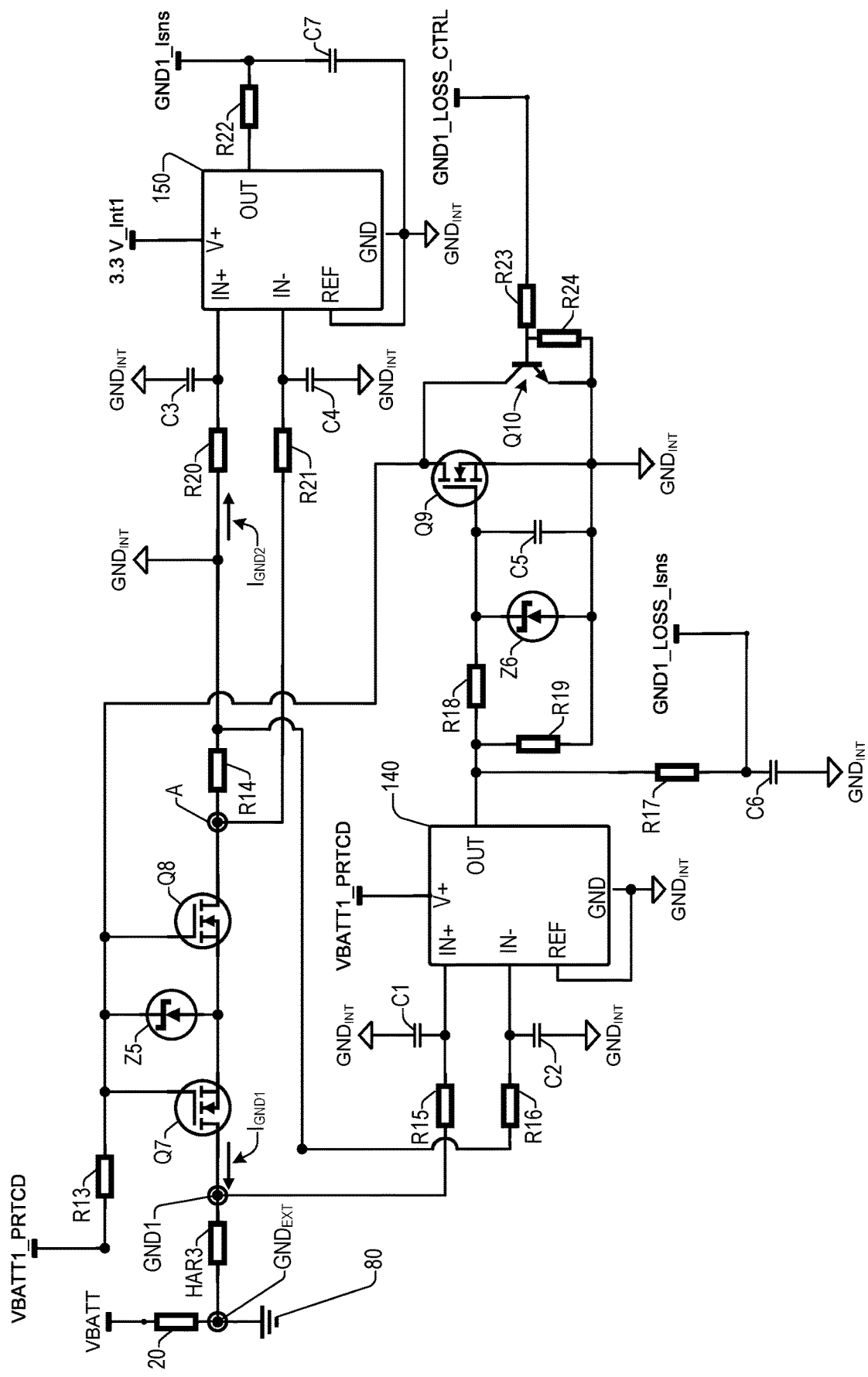
FIG. 9 illustrates an example of a first protection circuit, first sensing circuits and a third wiring harness connected to a main ground according to some implementations.

FIG. 9 illustrates an example of the first protection and sensing circuitry which includes a first protection circuit, first sensing circuits and the third wiring harness connected to a main ground according to some implementations. The first protection circuit and the first sensing circuits are operable to protect against a ground fault occurring which may cause external current to flow through the third wiring harness HAR3 and into the ECU 10 both when the ECU 10 is in the non-operational state (e.g., OFF state) and also when the ECU 10 is in the operational state (e.g., ON state).

In FIG. 9, a seventh n-type MOSFET (nMOSFET) Q7 and an eighth nMOSFET Q8 are connected in a common source configuration, but may also be connected in a common drain configuration. The seventh nMOSFET Q7 and the eighth nMOSFET Q8 configure a first bidirectional load switch circuit. Gates of the seventh nMOSFET Q7 and the eighth nMOSFET Q8 are connected via a thirteenth resistance R13 to receive the first protection voltage VBATT1_PRTCD which may be generated as shown in FIG. 7. A fifth zener diode Z5 is connected between the gates of the seventh nMOSFET Q7 and the eighth nMOSFET Q8 and the sources of the seventh nMOSFET Q7 and the eighth nMOSFET Q8. A drain of the seventh nMOSFET Q7 is connected by the third wiring harness HAR3 to the first main ground 80. A drain of the eighth nMOSFET Q8 is connected to the internal ground $GND_{INT}$ of the ECU 10 by a fourteenth resistance R14. Accordingly, the seventh nMOSFET Q7 and the eighth nMOSFET Q8 define a current path between the third wiring harness HAR3 and the internal ground $GND_{INT}$ of the ECU 10.

Further, the first sensing circuitry includes a first current sense amplifier 140 and a second current sense amplifier 150. The first current sense amplifier 140 has a supply voltage terminal V+ which is connected to receive the first protection voltage VBATT1_PRTCD and a reference terminal REF and a ground terminal GND which are connected to the internal ground $GND_{INT}$. The first current sense amplifier 140 also has a first input terminal IN+ connected to the drain of the seventh nMOSFET Q7 by a fifteenth resistance R15 and a second input terminal IN− connected between the fourteenth resistance R14 and the internal ground $GND_{INT}$. Accordingly, signals received at the first input terminal IN+ and the second input terminal IN− allow the first current sense amplifier 140 to amplify a differential corresponding to a current flow between the third wiring harness HAR3 and the seventh nMOSFET Q7 and a current flow between the fourteenth resistance R14 and the internal ground $GND_{INT}$. By way of example only, the first current sense amplifier 140 may be configured to have a gain of 500 V/V or another gain value which compensates for variation in drain-source ON resistance of the seventh nMOSFET Q7 and the eighth nMOSFET Q8. An output terminal OUT of the first current sense amplifier 140 is connected to a seventeenth resistance R17, an eighteenth resistance R18, and a nineteenth resistance R19 for purposes which will be explained later. The seventeenth resistance R17 generates a first control signal GND1_LOSS_Isns for purposes which will be explained later.

In addition, the second current sense amplifier 150 has a supply voltage terminal V+ which is connected to receive a different voltage than then the supply voltage terminal V+ of the first current sense amplifier 140. For example, the supply voltage terminal V+ of the second current sense amplifier 150 may receive 3.3 V which is internally generated within the ECU 10 or another voltage which corresponds to the ECU 10 being in the operational state. A reference terminal REG and a ground terminal GND of the second current sense amplifier 150 are connected to the internal ground $GND_{INT}$. The first current sense amplifier 140 also has a first input terminal IN+ connected to the internal ground $GND_{INT}$ by a twentieth resistance R20 and a second input terminal IN− connected between the eighth nMOSFET Q8 and the fourteenth resistance R14 by a twenty-first resistance R21. Accordingly, signals received at the first input terminal IN+ and the second input terminal IN− allow the second current sense amplifier 150 to amplify a differential corresponding to a current flow through the fourteenth resistance R14 itself when the ECU is in the operational state. The second current sense amplifier 150 may be configured to have a gain which is lower than the first current sense amplifier 140. By way of example only, the second current sense amplifier 150 may have a gain of 100 V/V. An output terminal OUT of the second current sense amplifier 150 is connected to a twenty-second resistance R22 which generates a second control signal GND1_Isns for purposes which will be explained later.

Further, as shown in FIG. 9, capacitances C1, C2, C3 and C4 may be provided to reduce noise at the respective input terminals of the first and second sense amplifiers 140, 150.

A ninth nMOSFET Q9 has a gate which is connected to the eighteenth resistance R18, a source which is connected to the internal ground $GND_{INT}$, and a drain which is connected to the gates of the seventh nMOSFET Q7 and the eighth nMOSFET Q8. The nineteenth resistance R19 is connected between the output terminal OUT of the first sense amplifier 140 and the source of the ninth nMOSFET Q9. Additionally, a sixth zener diode Z6 and a fifth capacitance are connected between the gate and the source of the ninth nMOSFET Q9.

A NPN BJT Q10 has a collector which is connected to the gates of the seventh nMOSFET Q7 and the eighth nMOSFET Q8, an emitter which is connected to the internal ground $GND_{INT}$, and a base which is connected to a twenty-third resistance R23. A twenty-fourth resistance R24 is connected between the base and the emitter of the BJT Q10. The twenty-third resistance R23 is connected to receive a third control signal GND1_LOSS_CTRL. The ninth nMOSFET Q9 and the BJT Q10 configure a first gate control circuit for the first bidirectional load switch circuit.

In a normal state where no ground fault has occurred with respect to the third wiring harness HAR3 and the first main ground 80, a current path from the internal ground $GND_{INT}$ of the ECU 10 through the fourteenth resistance R14 and further through the seventh nMOSFET Q7 and the eighth nMOSFET Q8 to the third wiring harness HAR3 is provided by controlling the gates of the seventh nMOSFET Q7 and the eighth nMOSFET Q8. In the normal state and when the ECU 10 is in the OFF state, the second current sense amplifier 150 is also in a non-operational state (e.g., OFF state). Meanwhile, the first current sense amplifier 140 is in an operational state since the supply voltage terminal V+ thereof receives the first protection voltage VBATT1_PRTCD which may be generated as in FIG. 7. Accordingly, the first current sense amplifier 140 operates to amplify a differential between IN+ and IN− terminals corresponding to the current flow between the third wiring harness HAR3 and the seventh nMOSFET Q7 and the current flow between the fourteenth resistance R14 and the internal ground $GND_{INT}$.

In circumstances where the differential indicates the current flow from the seventh nMOSFET Q7 to the internal ground $GND_{INT}$ is zero or close thereto, such as below a predetermined threshold value, a voltage level at the output terminal OUT of the first current sense amplifier 140 will likewise be zero or close thereto. In turn, a value of the first control signal GND1_LOSS_Isns taken between the seventeenth resistance and a sixth capacitance C6 will reflect the voltage level at the output terminal OUT being zero or close thereto. Similarly, the voltage level at the output terminal OUT of the first current sense amplifier 140 being zero or close thereto will keep the ninth nMOSFET Q9 in an OFF state. Consequently, the gates of the seventh nMOSFET Q7 and the eighth nMOSFET Q8 will be in an ON state which allows the internal ground $GND_{INT}$ of the ECU 10 to be connected to the first main ground 80 via the third wiring harness HAR3.

In comparison, when the ECU 10 is in the OFF state, a ground fault may occur with respect to the third wiring harness HAR3 and the first main ground 80 which may effectively cause the first main ground 80 to be disconnected at a point GND1 in FIG. 9. The occurrence of the ground fault may lead to external current from the first external load 20 flowing through the third wiring harness in the direction of the fourteenth resistance R14 and the internal ground $GND_{INT}$ instead of flowing to the first main ground 80. As the ECU 10 is in the OFF state, the second current sense amplifier 150 will also be non-operational. Meanwhile, the first current sense amplifier 140 is in the operational state since the supply voltage terminal V+ receives the first protection voltage VBATT1_PRTCD. Accordingly, the first current sense amplifier 140 operates to amplify the differential between IN+ and IN− terminals corresponding to the current flow between the third wiring harness HAR3 and the seventh nMOSFET Q7 and the current flow between the fourteenth resistance R14 and the internal ground $GND_{INT}$.

Due to the occurrence of the foregoing ground fault state, the differential between IN+ and IN− terminals may indicate the current flow from the seventh nMOSFET Q7 to the internal ground $GND_{INT}$ is non-zero, such as above the predetermined threshold value. In turn, the value of the first control signal GND1_LOSS_Isns corresponding to the output terminal OUT will also indicate the current flow from the seventh nMOSFET Q7 to the internal ground $GND_{INT}$ is non-zero. Similarly, the voltage level at the output terminal OUT of the first current sense amplifier 140 will cause the ninth nMOSFET Q9 to switch to an ON state. Consequently, the gates of the seventh nMOSFET Q7 and the eighth nMOSFET Q8 will be pulled low by the nMOSFET Q9 which allows the internal ground $GND_{INT}$ of the ECU 10 to be disconnected from the third wiring harness HAR3 thus protecting the ECU 10 from having ground fault current below the predetermined threshold value, such as from the external load 30, flow into the internal ground $GND_{INT}$ which may potentially damage components of the ECU 10. Accordingly, protection from undesired current flowing into the ECU 10 due to a ground fault occurring with respect to a current path provided by the third wiring harness HAR3 can be realized with the configuration of FIG. 9 when the ECU 10 is non-operational.

Figure 10:
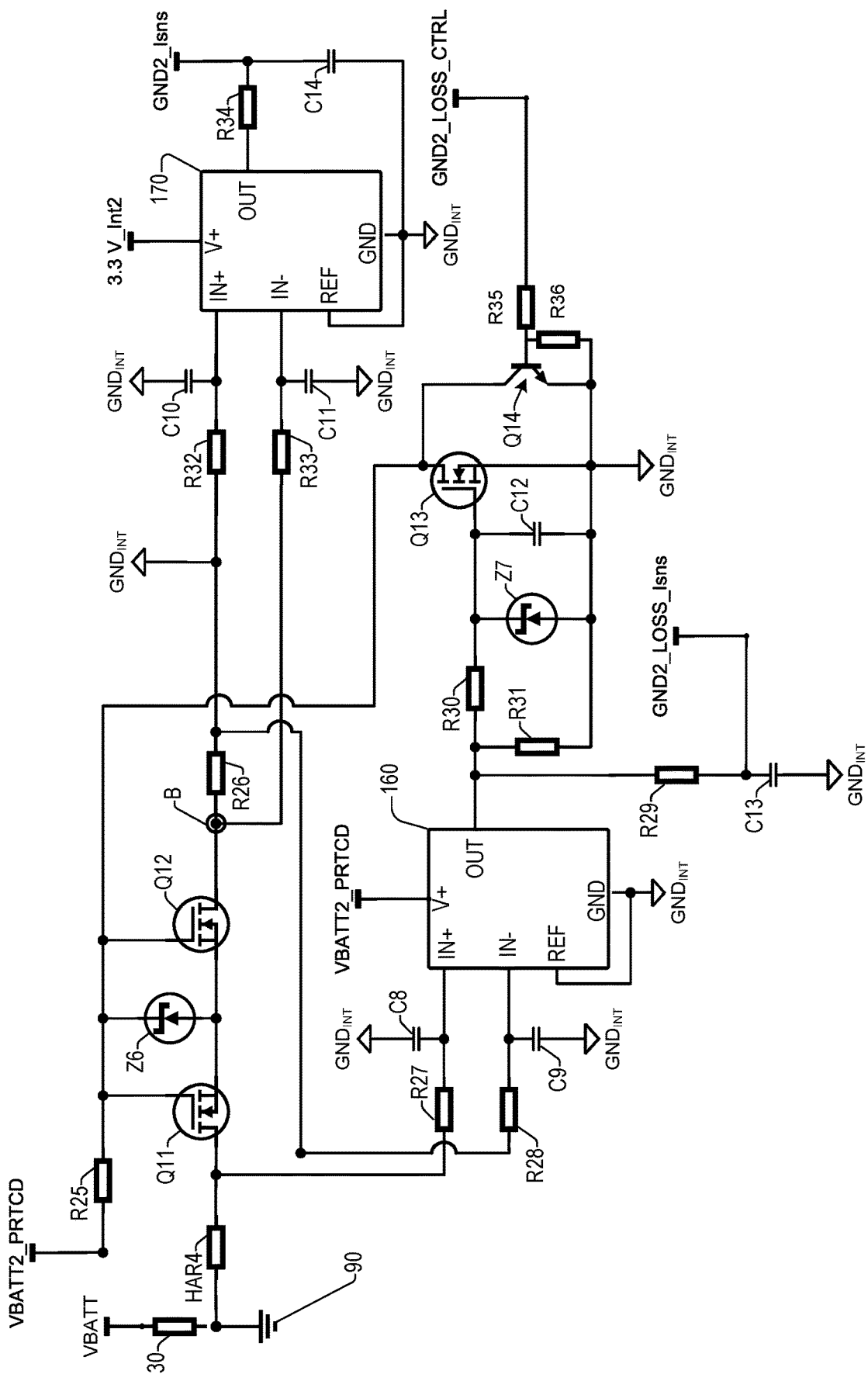
FIG. 10 illustrates an example of a second protection circuit, second sensing circuits and a fourth wiring harness connected to a main ground according to some implementations.

FIG. 10 illustrates an example of the second protection and sensing circuitry which includes a second protection circuit, second sensing circuits and a fourth wiring harness connected to a main ground according to some implementations. The configuration shown in FIG. 10 achieves similar advantageous effects as the configuration shown in FIG. 9 but for the fourth wiring harness HAR4 and second external load 30 which are connected to the second main ground 90. The second protection circuit and the second sensing circuits are operable to protect against a ground fault occurring which may cause external current to flow through the fourth wiring harness HAR4 and into the ECU 10 both when the ECU 10 is in the non-operational state (e.g., OFF state) and also when the ECU 10 is in the operational state (e.g., ON state).

In FIG. 10, an eleventh nMOSFET Q11 and a twelfth nMOSFET Q12 are connected in a common source configuration, but may also be connected in a common drain configuration, similar to the seventh nMOSFET Q7 and the eighth nMOSFET Q8. The eleventh nMOSFET Q11 and the twelfth nMOSFET Q12 configure a second bidirectional load switch circuit. Resistances R25, R26, R27, R28, R29, R30, R31, R32, R33, R34, R35 and R36 are connected in a manner similar to the resistances R13, R14, R15, R16, R17, R18, R19, R20, R21, R22, R23, and R24 in FIG. 9. Zener diodes Z7 and Z8 are connected in a manner similar to the zener diodes Z5 and Z6 in FIG. 9. Capacitances C7, C8, C9, C10, C11 and C12 are connected in a manner similar to the capacitances C1, C2, C3, C4, C5, and C6 in FIG. 9.

Gates of the eleventh nMOSFET Q11 and the twelfth nMOSFET Q12 are connected to receive the second protection voltage VBATT2_PRTCD which may be generated as shown in FIG. 8. A drain of the eleventh nMOSFET Q11 is connected by the fourth wiring harness HAR4 to the second main ground 90. A drain of the twelfth nMOSFET Q12 is connected to the internal ground $GND_{INT}$ of the ECU 10. Accordingly, the eleventh nMOSFET Q11 and the twelfth nMOSFET Q12 define a current path between the fourth wiring harness HAR4 and the internal ground $GND_{INT}$ of the ECU 10. Collectively, the seventh nMOSFET Q7 and the eighth nMOSFET Q8 with the eleventh nMOSFET Q11 and the twelfth nMOSFET Q12 provide dual ground paths for the internal ground $GND_{INT}$ of the ECU 10 to the main grounds 80 and 90. In some implementations, the main grounds 80 and 90 may correspond to a same physical location or to a same ground plane, such as a vehicle chassis.

Further, the second sensing circuitry includes a third current sense amplifier 160 and a fourth current sense amplifier 170. The third current sense amplifier 160 is generally configured in a similar manner as the first current sense amplifier 140 but the third current sense amplifier 160 has a supply voltage terminal V+ which is connected to receive the second protection voltage VBATT2_PRTCD. The third current sense amplifier 160 has a first input terminal IN+ connected to the drain of the eleventh nMOSFET Q11 and a second input terminal IN− connected between the twenty-sixth resistance R26 and the internal ground $GND_{INT}$. Accordingly, signals received at the first input terminal IN+ and the second input terminal IN− allow the third current sense amplifier 160 to amplify a differential corresponding to a current flow between the fourth wiring harness HAR4 and the eleventh nMOSFET Q11 and a current flow between the twenty-sixth resistance R26 and the internal ground $GND_{INT}$. In some implementations, the third current sense amplifier 160 may have a gain which is similar to the first current sense amplifier 140. An output terminal OUT of the third current sense amplifier 160 is connected to generate, via the twenty-ninth resistance R29, a third control signal GND2_LOSS_Isns for purposes which will be explained later.

In addition, the fourth current sense amplifier 170 is generally configured in a similar manner as the second current sense amplifier 150 but has a supply voltage terminal V+ which is connected to receive a different voltage than then the supply voltage terminal V+ of the third current sense amplifier 160. For example, the supply voltage terminal V+ of the fourth current sense amplifier 170 may receive 3.3 V which is internally generated within the ECU 10 or another voltage which corresponds to the ECU 10 being in the operational state. In some implementations, the supply voltage terminals V+ of the second and fourth current sense amplifiers 150, 170 may receive the same 3.3 V supply. The fourth current sense amplifier 170 has a first input terminal IN+ connected to the twenty-sixth resistance R26 by the thirty-second resistance R32 and a second input terminal IN− connected between the twelfth nMOSFET Q12 and the twenty-sixth resistance R26 by the thirty-third resistance R33. Accordingly, signals received at the first input terminal IN+ and the second input terminal IN− allow the fourth current sense amplifier 150 to amplify a differential corresponding to a current flow through the fourteenth resistance R14 itself when the ECU 10 is in the operational state. The fourth current sense amplifier 170 may be configured to have a gain which is lower than the third current sense amplifier 160. In some implementations, the fourth current sense amplifier 170 may have a gain of 100 V/V or another value which is similar to that of the second current sense amplifier 150. An output terminal OUT of the fourth current sense amplifier 170 is connected to the thirty-fourth resistance R34 which generates a fifth control signal GND1_Isns for purposes which will be explained later.

A thirteenth nMOSFET Q13 has a gate which is connected to the thirtieth resistance R30, a source which is connected to the internal ground $GND_{INT}$, and a drain which is connected to the gates of the eleventh nMOSFET Q11 and the twelfth nMOSFET Q12. The thirty-first resistance R19 is connected between the output terminal OUT of the first sense amplifier 140 and the source of the thirteenth nMOSFET Q13. Additionally, a seventh zener diode Z7 and a tenth capacitance C10 are connected between the gate and the source of the thirteenth nMOSFET Q13.

A NPN BJT Q14 has a collector which is connected to the gates of the eleventh nMOSFET Q11 and the twelfth nMOSFET Q12, an emitter which is connected to the internal ground $GND_{INT}$, and a base which is connected to the thirty-fifth resistance R35. The thirty-sixth resistance R36 is connected between the base and the emitter of the BJT Q14. The thirty-fifth resistance R35 is connected to receive a sixth control signal GND2_LOSS_CTRL. The thirteenth nMOSFET Q13 and the BJT Q14 configure a second gate control circuit for the second bidirectional load switch circuit.

In a normal state where no ground fault has occurred with respect to the fourth wiring harness HAR4 and the second main ground 90, a current path from the internal ground $GND_{INT}$ of the ECU 10 through the twenty-sixth resistance R26 and further through the eleventh nMOSFET Q11 and the twelfth nMOSFET Q12 to the fourth wiring harness HAR4 is provided by controlling the gates of the eleventh nMOSFET Q11 and the twelfth nMOSFET Q12. In this respect, the configurations of FIGS. 9 and 10 are operable to respectively connect and disconnect the internal ground $GND_{INT}$ from the third wiring harness HAR3 and the fourth wiring harness HAR4. Further, in the normal state and when the ECU 10 is in the OFF state, the fourth current sense amplifier 170 is also in a non-operational state (e.g., OFF state). Meanwhile, the third current sense amplifier 160 is in an operational state since the supply voltage terminal V+ thereof receives the second protection voltage VBATT2_PRTCD which may be generated as in FIG. 8. Accordingly, the third current sense amplifier 160 operates to amplify a differential between IN+ and IN− terminals corresponding to the current flow between the fourth wiring harness HAR4 and the eleventh nMOSFET Q11 and the current flow between the twenty-sixth resistance R26 and the internal ground $GND_{INT}$.

In circumstances where the differential indicates the current flow from the eleventh nMOSFET Q11 to the internal ground $GND_{INT}$ is zero or close thereto, such as below a predetermined threshold value, a voltage level at the output terminal OUT of the third current sense amplifier 160 will likewise be zero or close thereto. In turn, the fourth control signal GND2_LOSS_Isns taken between the twenty-ninth resistance R29 and a twelfth capacitance C12 will reflect the voltage level at the output terminal OUT being zero or close thereto. Similarly, the thirteenth nMOSFET Q13 will be kept in an OFF state by the third current sense amplifier 160. Consequently, the gates of the eleventh nMOSFET Q11 and the twelfth nMOSFET Q12 will be in an ON state which allows the internal ground $GND_{INT}$ of the ECU 10 to be connected to the first main ground 80 via the third wiring harness HAR3.

In comparison, when the ECU 10 is in the OFF state, a ground fault may occur with respect to the fourth wiring harness HAR4 and the second main ground 90 which may effectively cause the second main ground 90 to be disconnected at a point GND2 in FIG. 9. The occurrence of the ground fault may lead to external current from the second external load 30 flowing through the fourth wiring harness in the direction of the twenty-sixth resistance R26 and the internal ground $GND_{INT}$ instead of flowing to the second main ground 90. As the ECU 10 is in the OFF state, the fourth current sense amplifier 170 will be non-operational. Meanwhile, the third current sense amplifier 160 is in the operational state since the supply voltage terminal V+ receives the second protection voltage VBATT2_PRTCD and operates to amplify the differential between IN+ and IN− terminals thereof corresponding to the current flow between the fourth wiring harness HAR4 and the eleventh nMOSFET Q11 and the current flow between the twenty-sixth resistance R26 and the internal ground $GND_{INT}$.

Due to the occurrence of the foregoing ground fault state, the differential between IN+ and IN− terminals may indicate the current flow from the eleventh nMOSFET Q11 to the internal ground $GND_{INT}$ is non-zero, such as above the predetermined threshold value. In turn, the value of the first control signal GND1_LOSS_Isns corresponding to the output terminal OUT will also indicate the current flow from the eleventh nMOSFET Q11 to the internal ground $GND_{INT}$ is non-zero. Similarly, the voltage level at the output terminal OUT of the third current sense amplifier 160 will cause the thirteenth nMOSFET Q13 to switch to an ON state. Consequently, the gates of the eleventh nMOSFET Q11 and the twelfth nMOSFET Q12 will be pulled low by the nMOSFET Q13 which allows the internal ground $GND_{INT}$ of the ECU 10 to be disconnected from the fourth wiring harness HAR4 thus protecting the ECU 10 from having ground fault current below the predetermined threshold value, such as from the external load 30, flow into the internal ground $GND_{INT}$ which may potentially damage components of the ECU 10. Thus, similar to FIG. 9, protection from undesired current flowing into the ECU 10 due to a ground fault occurring with respect to a current path provided by the fourth wiring harness HAR4 can be realized with the configuration of FIG. 10 when the ECU 10 is non-operational.

While the foregoing descriptions of FIGS. 9 and 10 have been made with respect to when the ECU 10 is non-operational, a similar current protection effect can be realized when the ECU is operational (e.g., ON state). For example, in FIG. 9, after the ECU 10 is caused to enter the ON state by receiving the wakeup signal WAKEUP, the second current sense amplifier 150 will begin to operate due to receiving the supply voltage of 3.3 V which is internally generated within the ECU 10 or another voltage which corresponds to the ECU 10 being in the operational state. Here, both the first current sense amplifier 140 and the second current sense amplifier 150 will operate to monitor current flows along the current path between the seventh nMOSFET Q7 and the internal ground $GND_{INT}$. Thus, when the ECU 10 is operating, the first current sense amplifier 140 will generate an output indicative of whether there is an incoming current flow above the predetermined threshold value from the seventh nMOSFET Q7 to the internal ground $GND_{INT}$ while the second current sense amplifier 150 will generate a value at the output terminal OUT thereof which is indicative of whether there is a current flow with respect to the fourteenth resistance R14. As the second current sense amplifier 150 may be configured to have a gain which is lower than the first current sense amplifier 140, the second current sense amplifier 150 may be operative to generate a value at the output terminal OUT thereof which is indicative of whether there is a current flow below the predetermined value with respect to the fourteenth resistance R14. Accordingly, the second control signal GND1_Isns can provide an accurate reflection of current flow below the predetermined value whereas the first control signal GND1_LOSS_Isns provides an indication of current flow above the predetermined value.

By way of example only, the first current sense amplifier 140 may be configured to have a gain which generates a value of the output terminal OUT thereof which is operable to turn the ninth nMOSFET Q9 to the ON state when the sensed current flow through the seventh nMOSFET Q7 towards the internal ground $GND_{INT}$ is above 0.375 A or a similar predetermined value. In addition, the second current sense amplifier 150 may be configured to have a gain which generates a value of the output terminal OUT thereof which is indicative of when the sensed current flow through the fourteenth resistance R14 towards the internal ground $GND_{INT}$ is equal to or below 0.375 A or a similar predetermined value.

Further, after the ECU 10 is caused to enter the ON state by receiving the wakeup signal WAKEUP, the third and fourth current sense amplifiers 160, 170 may operable in a manner which is substantially similar to the first and second current sense amplifiers 140, 150 as described above.

Figure 11:
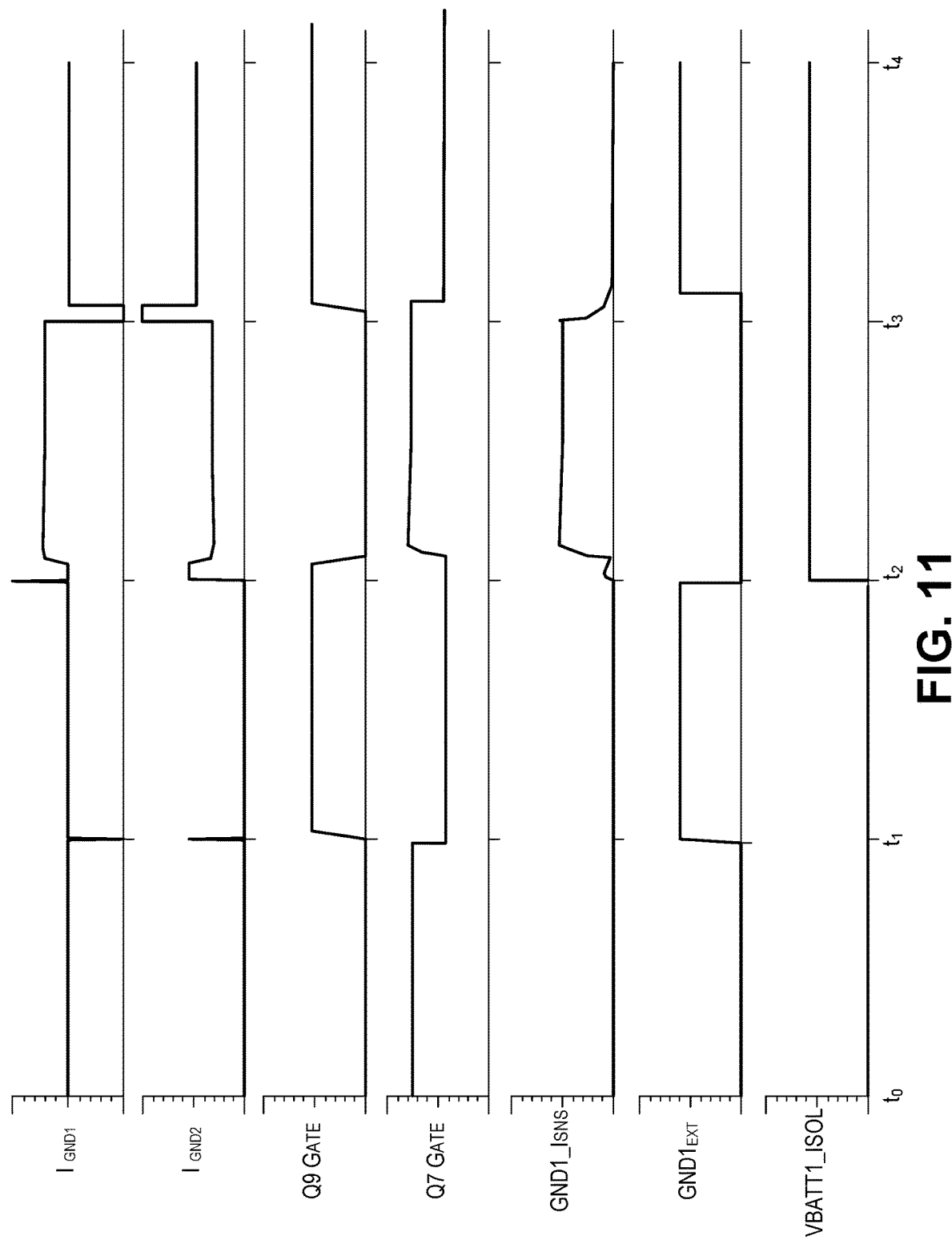
FIG. 11 illustrates a timing diagram for a first protection and sensing circuitry shown in FIG. 9 according to some implementations.

FIG. 11 illustrates a timing diagram for the first protection and sensing circuitry shown in FIG. 9 according to some implementations. It should be appreciated that the second protection and sensing circuitry shown in FIG. 10 may have similar timing and control for according to some implementations. In FIG. 11, "$I_{GND1}$" corresponds to a current flow in FIG. 9 relative to the third wiring harness HAR3 and the seventh nMOSFET Q7, and "$I_{GND2}$" corresponds to a current flow in FIG. 9 relative to the first input terminal IN+ of the second current sense amplifier 150. "Q9 Gate" corresponds to a voltage at the gate of the ninth nMOSFET Q9 in FIG. 9. "Q7 Gate" corresponds to a voltage at the gate of the seventh nMOSFET Q7 in FIG. 9. "GND1_Isns" corresponds to the second control signal GND1_Isns generated by the output terminal OUT of the second current sense amplifier 150 in FIG. 9. "$GND1_{EXT}$" corresponds to a node at which the third wiring harness HAR3 and the seventh nMOSFET Q7 are connected in FIG. 9 and as also shown in FIG. 1.

In FIG. 11, a period from a time $t_0$ to a time $t_1$ corresponds to the ECU 10 being in a non-operational state and no ground fault having occurred. Here, $I_{GND1}$ and $I_{GND2}$ are substantially level and indicative that current is flowing from the internal ground $GND_{INT}$ to the first main ground 80 as is normally expected while Q9 Gate is set to a low level indicative that the nMOSFET Q9 in an OFF state, and Q7 Gate is set to a high level indicative that the nMOSFET Q7, as well as nMOSFET Q8, is in an ON state. At approximately the time $t_1$, a ground fault occurs as shown by the spikes in $I_{GND1}$ and $I_{GND2}$ and Q9 Gate is caused to transit to a high level to switch the nMOSFET Q9 to an ON state which in turn pulls Q7 Gate to a low level indicative that the nMOSFET Q7, as well as nMOSFET Q8, is in an OFF state which disconnects the ECU 10 from the third wiring harness HAR3 to protect the ECU 10 from undesirable current as indicated by GND1 during a period from after the ground fault at the time $t_1$ to a time $t_2$.

Next, in FIG. 11, a period from after a time $t_2$ to a time $t_3$ corresponds to the ECU 10 being in an operational state (e.g., supplied with VBATT_ISOL1) and no ground fault having occurred. Here, $I_{GND1}$ and $I_{GND2}$ are substantially level and indicative that current is flowing from the internal loads 120, 130 of the ECU 10 as is normally expected. Again, Q9 Gate is set to a low level indicative that the nMOSFET Q9 in an OFF state, and Q7 Gate is set a high level indicative that the nMOSFET Q7, as well as nMOSFET Q8, is in an ON state. At approximately the time $t_3$, a ground fault occurs as shown by the spikes in $I_{GND1}$ and $I_{GND2}$. In response to the ground fault and at least up to the time $t_4$, Q9 Gate may be caused to transit to a high level to switch the nMOSFET Q9 to an ON state which in turn pulls Q7 Gate to a low level indicative that the nMOSFET Q7, as well as nMOSFET Q8, is in an OFF state which disconnects the ECU 10 from the third wiring harness HAR3 to protect the ECU 10 from undesirable current as indicated by GND1 during a period from after the ground fault at the time $t_3$ to a time $t_4$. Further, as the ECU 10 is in an operational state, the second control signal GND1_Isns is output by the second current sense amplifier 150 as shown from the time $t_2$ and the time $t_4$. As previously described, the second control signal GND1_Isns is indicative of current flow (e.g., GND1) below the predetermined value which is not sensed by the first current sense amplifier 140. In some implementations, the first control signal GND1_LOSS_Isns and the second control signal GND1_Isns can be used as inputs to manipulate a value of the third control signal GND1_LOSS_CTRL to achieve an effect at the BJT Q10 which is similar to the ninth nMOSFET Q9 (e.g., Q9 Gate in FIG. 11). Accordingly, the second control signal GND1_Isns can serve as a basis for control of the BJT Q10 for undesirable current flow below the predetermined value while Q9 Gate serves as a basis for control of the nMOSFET Q9 for undesirable current flow above the predetermined value.

Figure 12:
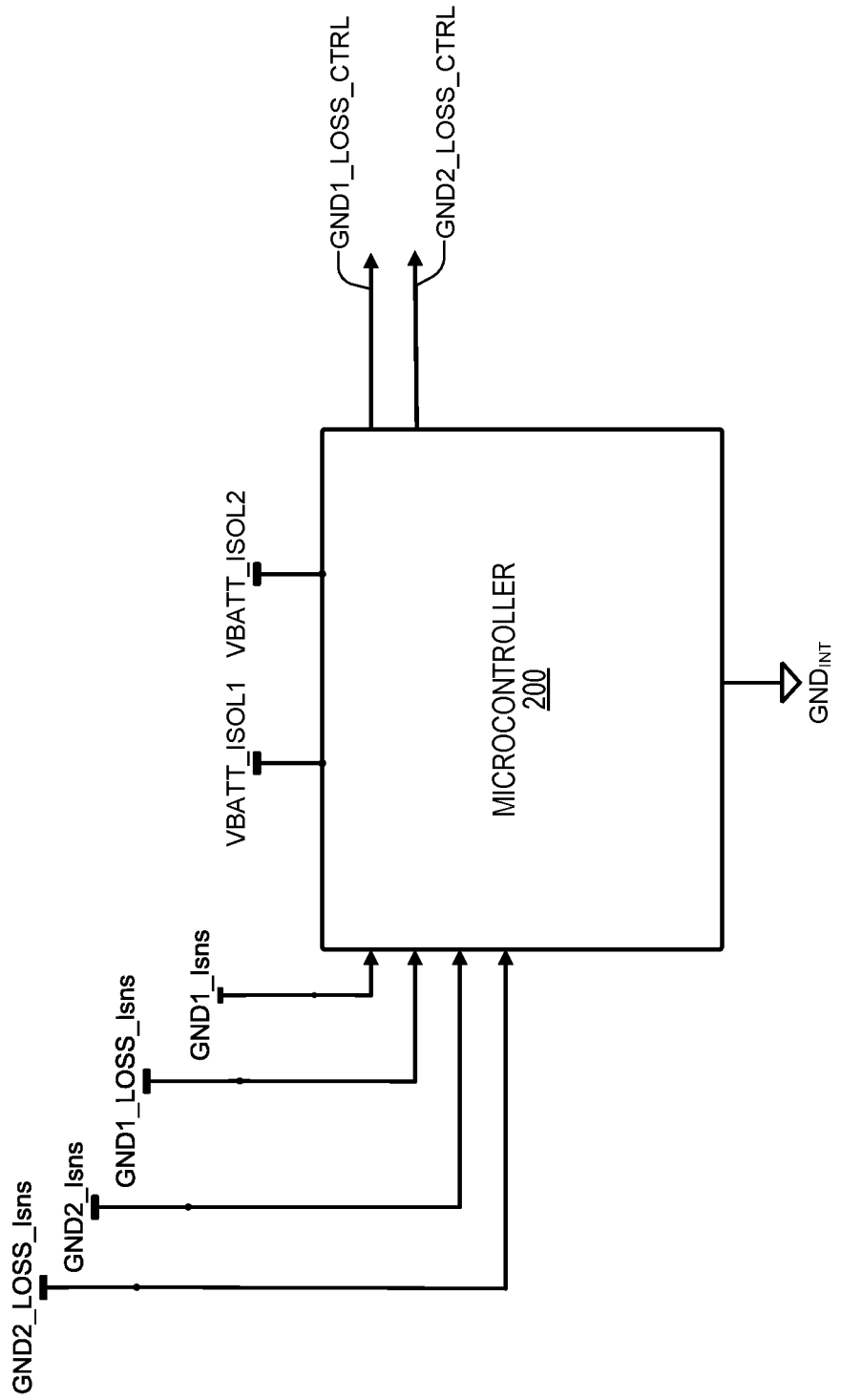
FIG. 12 illustrates an example of a microcontroller according to some implementations.

FIG. 12 illustrates an example of a microcontroller 200 according to some implementations to provide control while the ECU 10 is in the operational state. In some implementations, the microcontroller 200 is provided as an internal component of the ECU 10 and may be programmed to execute control of the BJTs Q10 and Q14 as illustrated in FIG. 11. By way of example only, the microcontroller 200 may correspond to the first and/or second internal loads 120, 130 of the ECU 10. As shown in FIG. 12, the microcontroller 200 is connected to the first and second current sense amplifiers 140, 150 of FIG. 9 to receive the first control signal GND1_LOSS_Isns and the second control signal GND1_Isns. In a similar manner, the microcontroller 200 may also be connected to the third and fourth current sense amplifiers 160, 170 of FIG. 10 to receive the fourth control signal GND1_LOSS_Isns and the fifth control signal GND1_Isns. The microcontroller can be programmed to output the third control signal GND1_LOSS_CTRL to cause the BJT Q10 to operate in a manner similar to the control of the nMOSFET Q9. While the particular programming and timing used to output the third control signal GND1_LOSS_CTRL may vary according to specific applications and design tolerances of the ECU 10, due to the gain differences between the first sense amplifier 140 and the second sense amplifier 150 in FIG. 9, the output of the third control signal GND1_LOSS_CTRL on the basis of at least the second control signal GND1_Isns, if not also the first control signal GND1_Isns, can achieve a protective effect with BJT Q10 for undesired current below the predetermined value which is similar to the protective effect achieved with the nMOSFET Q9 for undesired current above the predetermined value. Similar, programming and timing can be used to output the sixth control signal GND2_LOSS_CTRL in FIG. 10 by the microcontroller 200. In some implementations, the predetermined value of current which causes the nMOSFET Q9 to turn ON may be 0.375 A or another value depending on the specific application and design tolerance of the ECU 10. It should be appreciated that the microcontroller can also be programmed to output the sixth control signal GND2_LOSS_CTRL to cause the BJT Q14 to operate in a manner similar to the control of the nMOSFET Q13 to achieve a similar protective effect with respect to the fourth wiring harness HAR4.

As mentioned above, in some examples, the configuration which is collectively shown in FIGS. 9, 10 and 12 facilitate separate control of respective current paths between the third wiring harness HAR3 and the internal ground $GND_{INT}$ and between the fourth wiring harness HAR4 and the internal ground $GND_{INT}$ while the ECU 10 is not operating as well as when the ECU 10 is operating. Accordingly, when the ECU 10 is provided in an environment where the ECU 10 shares electrical connection to dual main ground paths with external loads 20, 30, the ECU 10 can be protected from being damaged by undesirable current flow which arises due to a ground fault along the main ground paths.

Figure 13:
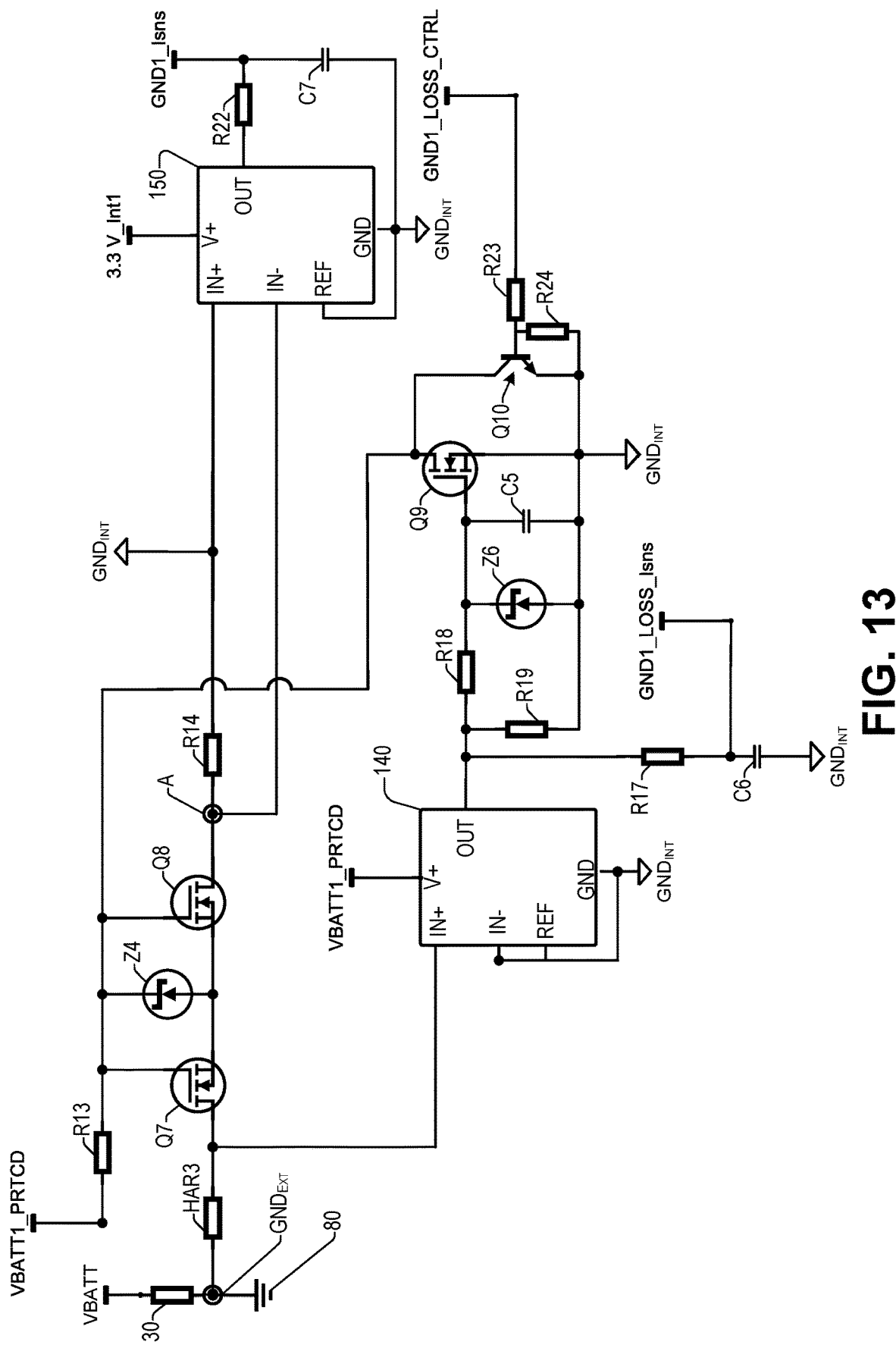
FIG. 13 illustrates an example of another first protection circuit, other first sensing circuits and a third wiring harness connected to a main ground path according to some other implementations.

FIG. 13 illustrates an example of another first protection circuit, other first sensing circuits and a third wiring harness connected to a main ground path according to some implementations. In FIG. 13, the seventh n-type MOSFET Q7 and the eighth nMOSFET Q8 are connected to the ninth nMOSFET Q9 and the BJT Q10 in a manner similar to FIG. 9. Further, the second current sense amplifier 150 is configured in a manner similar to FIG. 9. However, the first current sense amplifier 140 in FIG. 13 has a simplified configuration as compared to the first current sense amplifier 140 of FIG. 9. Particularly, the first current sense amplifier 140 has a first input terminal IN+ connected to the drain of the seventh nMOSFET Q7 and a second input terminal IN– connected in common with a reference terminal REF and a ground terminal GND to the internal ground $GND_{INT}$ of the ECU 10. In this implementation, the first current sense amplifier 140 operates to amplify a differential between IN+ and IN– terminals corresponding to the current flow between the third wiring harness HAR3 and the seventh nMOSFET Q7 and the internal ground $GND_{INT}$. An output terminal OUT of the first current sense amplifier 140 in FIG. 13 is arranged similarly to that shown in FIG. 9.

Figure 14:
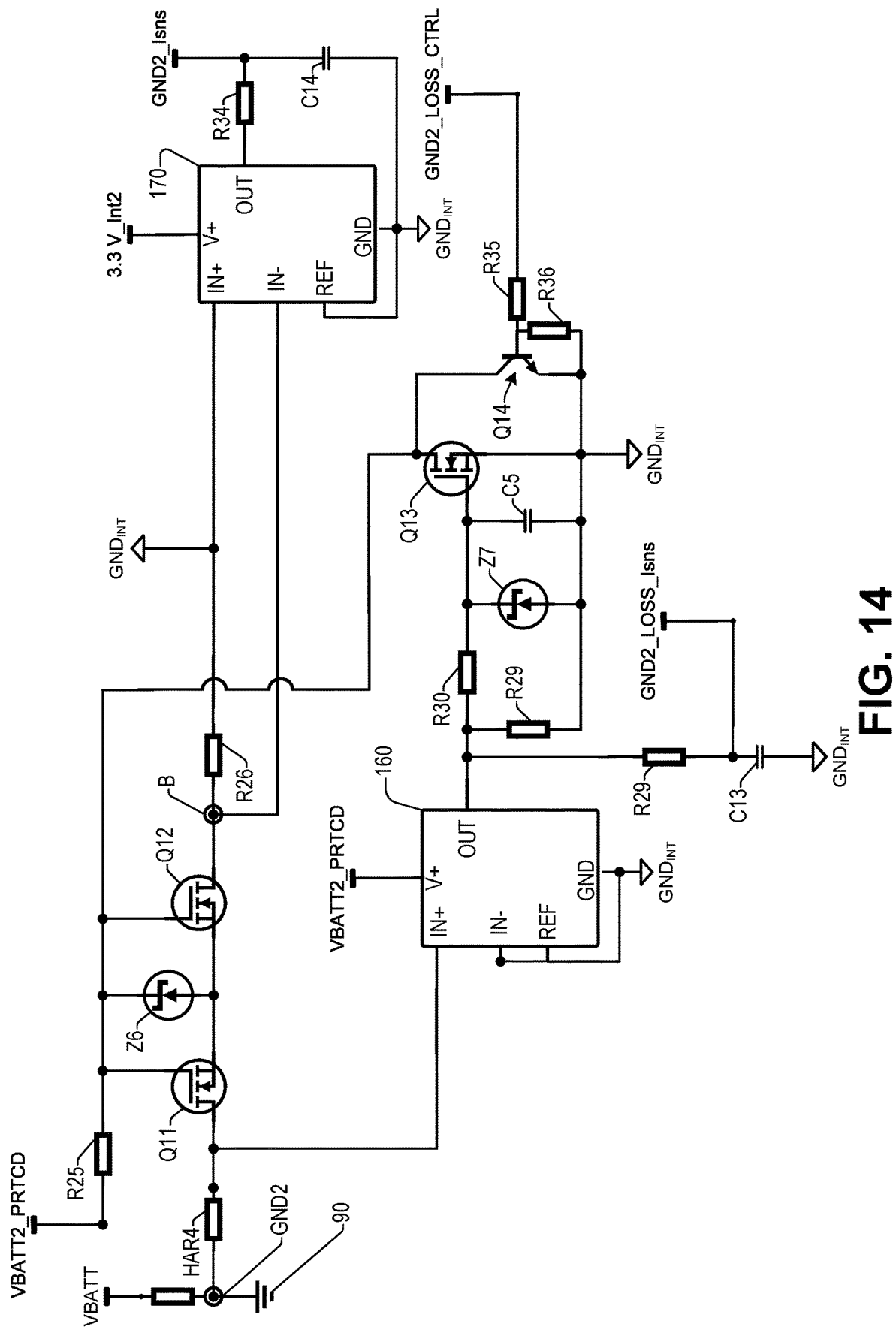
FIG. 14 illustrates an example of another second protection circuit, other second sensing circuits and a fourth wiring harness connected to a main ground path according to some other implementations.

FIG. 14 illustrates an example of another second protection circuit, other second sensing circuits and a fourth wiring harness connected to a main ground path according to some other implementations. In FIG. 13, the eleventh n-type MOSFET Q1 and the twelfth nMOSFET Q12 are connected to the thirteenth nMOSFET Q13 and the BJT Q14 in a manner similar to FIG. 10. Further, the fourth current sense amplifier 170 is configured in a manner similar to FIG. 10. However, the third current sense amplifier 160 in FIG. 14 has a simplified configuration as compared to the third current sense amplifier 160 of FIG. 10. Particularly, the first current sense amplifier 140 has a first input terminal IN+ connected to the drain of the eleventh nMOSFET Q11 and a second input terminal IN– connected in common with a reference terminal REF and a ground terminal GND to the internal ground $GND_{INT}$ of the ECU 10. In this implementation, the third current sense amplifier 160 operates to amplify a differential between IN+ and IN– terminals corresponding to the current flow between the third wiring harness HAR4 and the eleventh nMOSFET Q11 and the internal ground $GND_{INT}$. An output terminal OUT of the third current sense amplifier 160 in FIG. 13 is arranged similarly to that shown in FIG. 10.

Figure 15:
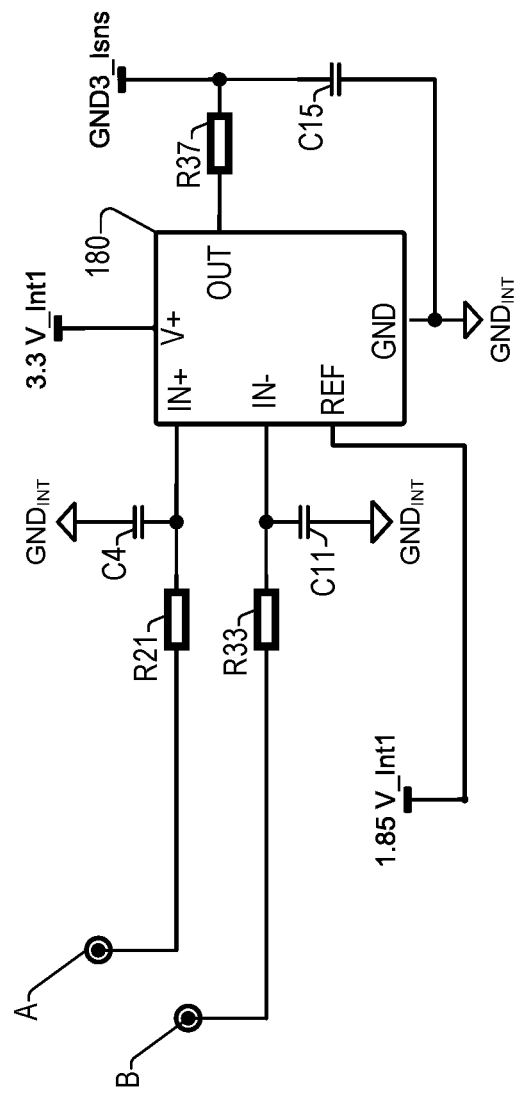
FIG. 15 illustrates an example of a modification of the sensing circuits according to some other implementations.

FIG. 15 illustrates an example of a modification of the second sensing circuitry according to some other implementations. As shown in FIG. 15, a fifth current sense amplifier 180 has a supply voltage terminal V+ which is connected to receive a different voltage than then the supply voltage terminal V+ of the first current sense amplifier 140 and/or the third current sense amplifier 160. For example, the supply voltage terminal V+ of the fifth current sense amplifier 180 may receive 3.3 V which is internally generated within the ECU 10 or another voltage which corresponds to the ECU 10 being in the operational state. A reference terminal REG of the fifth current sense amplifier 180 is connected to receive 1.8 V which is internally generated within the ECU 10 or another intermediate voltage which is between the voltage supplied to the supply voltage terminal V+ and the internal ground $GND_{INT}$. A ground terminal GND of the fifth current sense amplifier 180 is connected to the internal ground $GND_{INT}$. The fifth current sense amplifier 180 also has a first input terminal IN+ connected to a node "A" by the twenty-first resistance R21 and a second input terminal IN– connected to a node "B" by the thirty-third resistance R33. Further, capacitances C4 and C11 may be provided to reduce noise at the respective input terminals of the fifth current sense amplifier 180. An output terminal OUT of the fifth current sense amplifier is connected to a thirty-seventh resistance R37 which generates a seventh control signal GND3_Isns for purposes which will be explained below. A capacitance C15 may couple the thirty-seventh resistance R37 to the internal ground $GND_{INT}$.

In some implementations, the fifth current sense amplifier 180 replaces the second current sense amplifier 150 and the fourth current sense amplifier 170. More specifically, the node "B" to which the second input terminal IN+ of the fifth current sense amplifier 180 is connected corresponds to the node "B" shown in FIG. 10 between the twelfth nMOSFET Q12 and the fourteenth resistance. The node "A" to which the first input terminal IN– of the fifth current sense amplifier 180 is connected corresponds to the node "A" shown in FIG. 9 between the eighth nMOSFET Q8 and the fourteenth resistance. With this arrangement of the fifth current sense amplifier 180, the eighth nMOSFET Q8 remains coupled to the fourteenth resistance R14 which is in turn coupled to the internal ground $GND_{INT}$ as in FIG. 9 with the second current sense amplifier 150 and associated components being omitted, while the twelfth nMOSFET Q12 remains coupled to the twenty-sixth resistance R26 which is in turn coupled to the internal ground $GND_{INT}$ with the fourth current sense amplifier 170 and associated components being omitted.

Figure 16:
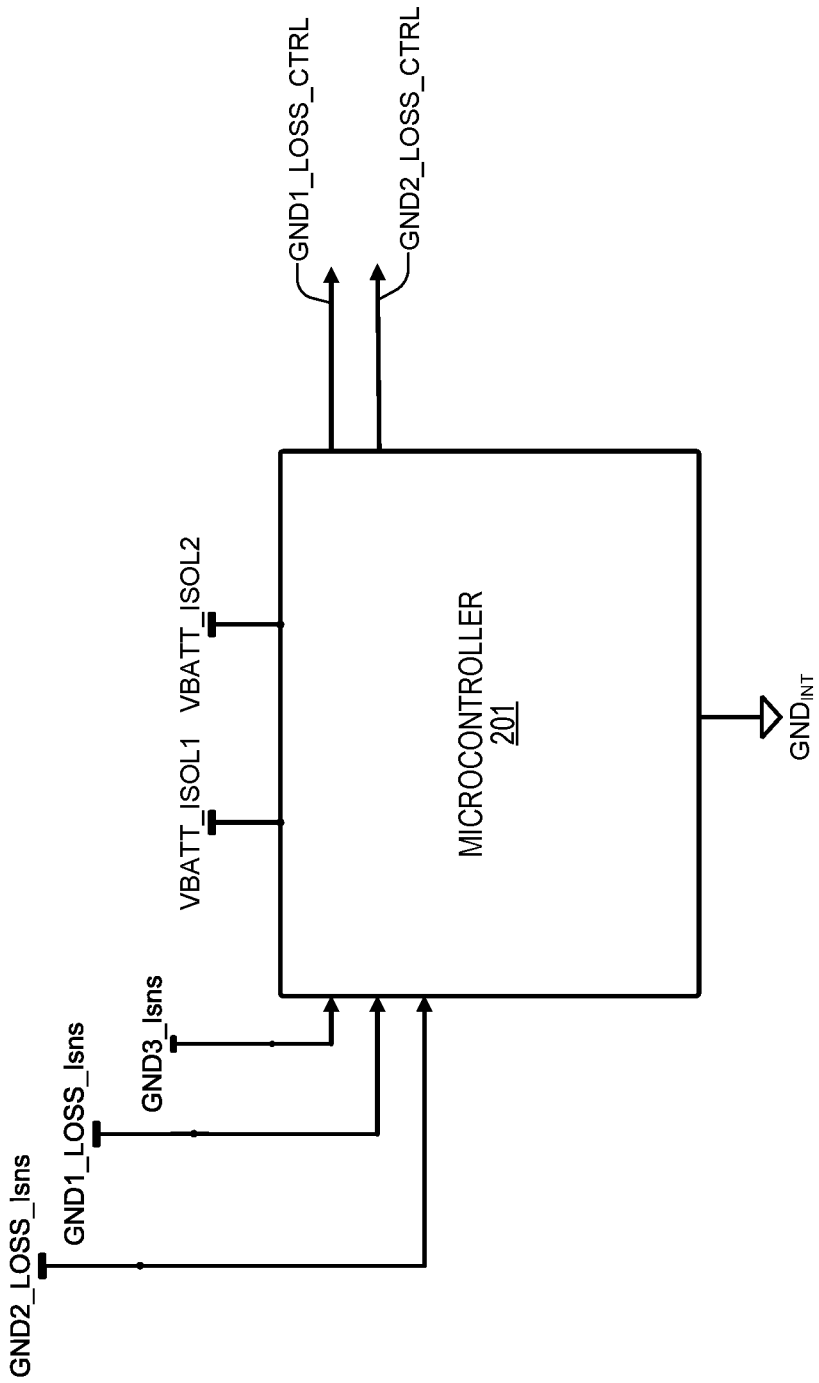
FIG. 16 illustrates another example of a microcontroller according to some other implementations.
Figure 17:
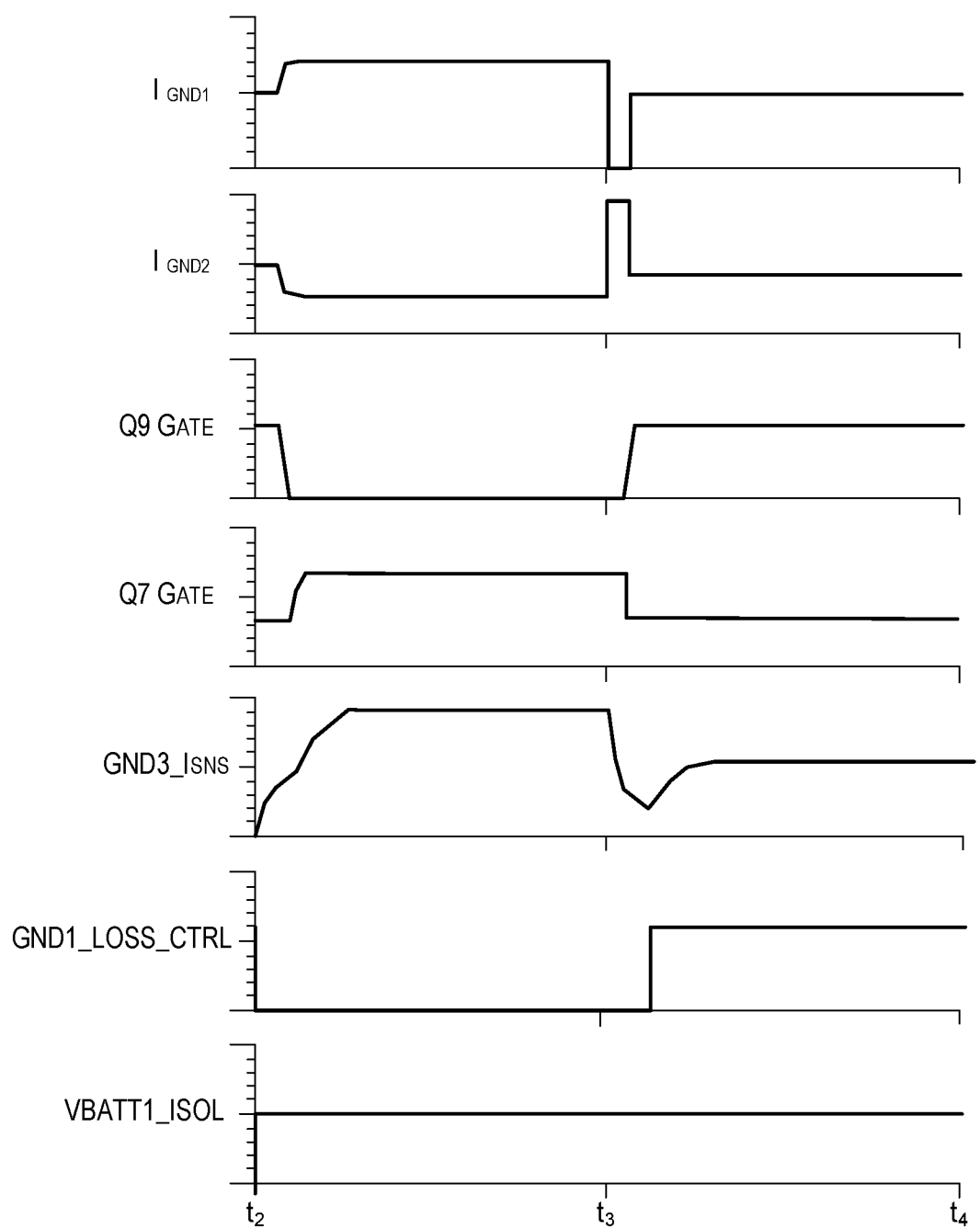
FIG. 17 illustrates a timing diagram for circuits shown in FIGS. 15 and 16 according to some implementations.

FIG. 16 illustrates another example of a microcontroller 201 provided in conjunction with the fifth current sense amplifier 180 of FIG. 15. As the fifth current sense amplifier 180 replaces the second and fourth current sense amplifiers 150, 170, the microcontroller 201 in FIG. 16 is coupled to receive the first control signal GND1_LOSS_Isns corresponding to the output of the first current sense amplifier 140, the third control signal GND2_LOSS_Isns corresponding to the output of the third current sense amplifier 160, and the seventh control signal GND3_Isns corresponding to the output of the fifth current sense amplifier 180. Similar to the microcontroller 200 of FIG. 12, the microcontroller 201 of FIG. 16 can be programmed to output a third control signal GND1_LOSS_CTRL to cause the BJT Q10 to operate in a manner similar to the control of the nMOSFET Q9 and to output a sixth control signal GND2_LOSS_CTRL to cause the BJT Q14 to operate in a manner similar to the control of the nMOSFET Q13. While the particular programming and timing of the microcontroller 201 to output the third control signal GND1_LOSS_CTRL and the sixth control signal GND2_LOSS_CTRL may vary according to specific applications and design tolerances of the ECU 10, FIG. 17 illustrates a timing diagram for the implementations shown in FIGS. 15 and 16 according to some implementations. More particularly, FIG. 17 shows timing charts for a period from a time $t_2$ to a time $t_4$ which corresponds to a state where the ECU 10 is operational and the microcontroller 201 is executing programming to manipulate a value of the third control signal GND1_LOSS_CTRL to achieve an effect at the BJT Q10 to pull the gates of the nMOSFET Q7, as well as nMOSFET Q8, in response to detecting undesired current due to a ground fault.

In FIG. 17, the first isolated battery voltage VBATT_ISOL1 is supplied to one or more of the first internal load 120 and the second internal load 130 of the ECU 10 which corresponds to the ECU 10 being in the operational state. A period from the time $t_2$ to a time $t_3$ corresponds to the ECU 10 being in the operational state and no ground fault having occurred. A ground fault occurs at the time $t_3$. In response to the ground fault and at least to the time $t_4$, the ECU 10 is protected from damage by controlling the gate of the nMOSFET Q7 to disconnect the third wiring harness 3 from the internal ground $GND_{INT}$.

From the time $t_2$ to the time $t_3$, Q9 Gate transitions to a low value which causes the nMOSFET Q7 and the nMOSFET Q8 to conduct current on the path between the third wiring harness HAR3 and the internal ground $GND_{INT}$. In response, Q7 Gate rises to cause the seventh nMOSFET Q7 to turn ON and $I_{GND1}$ and $I_{GND2}$ indicate that current is flowing from the internal ground $GND_{INT}$ to the first main ground 80 as is normally expected. Further, GND3_Isns rises in response to Q7 Gate rising. The third control signal GND1_LOSS_CTRL is held at a low level by the microcontroller 201.

In FIG. 17, the ground fault occurs at the time $t_3$ as reflected in the sudden drop of $I_{GND1}$ and the sudden rise of $I_{GND2}$. When $I_{GND2}$ rises above the predetermined threshold value, the first current sense amplifier 140 is operable to cause the ninth nMOSFET Q9 to turn ON. Further, the microcontroller 201 is operable to receive the first control signal GND1_LOSS_Isns from the first current sense amplifier 140 and the seventh control signal GND3_Isns from the fifth current sense amplifier 180. In response to the ninth nMOSFET Q9 turning ON, Q7 Gate is pulled to a low level indicating that the nMOSFET Q7, as well as nMOSFET Q8, are transitioned to an OFF state which protects the ECU 10.

When $I_{GND2}$ rises but does not rise above the predetermined threshold value, the ninth nMOSFET Q9 is not turned ON by the first current sense amplifier 140 but the microcontroller 201 is operable to receive the first control signal GND1_LOSS_Isns from the first current sense amplifier 140 and the seventh control signal GND3_Isns from the fifth current sense amplifier 180. Accordingly, the microcontroller 201 can be programmed to output the third control signal GND1_LOSS_CTRL to the BJT Q10 to achieve a similar effect to Q9 Gate to cause Q7 Gate to be dropped to a low level indicating that the nMOSFET Q7, as well as nMOSFET Q8, are transitioned to an OFF state which protects the ECU 10.

While the particular programming and timing used to output the third control signal GND1_LOSS_CTRL may vary according to specific applications and design tolerances of the ECU 10, due to the gain differences between the first sense amplifier 140 and the fifth sense amplifier 180 in FIG. 15, the output of the third control signal GND1_LOSS_CTRL on the basis of at least the fifth control signal GND3_Isns, if not also the first control signal GND1_LOSS_Isns, can achieve a protective effect with BJT Q10 for undesired current below the predetermined value which is similar to the protective effect achieved with the nMOSFET Q9 for undesired current above the predetermined value. Similar, programming and timing can be used to output the sixth control signal GND2_LOSS_CTRL in FIG. 10 by the microcontroller 201. In some implementations, the predetermined value of current which causes the nMOSFET Q9 to turn ON may be 0.375 A or another value depending on the specific application and design tolerances of the ECU 10. It should be appreciated that the microcontroller 201 can also be programmed to output the sixth control signal GND2_LOSS_CTRL to cause the BJT Q14 to operate in a manner similar to the control of the nMOSFET Q13 to achieve a similar protective effect with respect to the fourth wiring harness HAR4.

The microcontroller 200 and/or the microcontroller 201, when included, may each comprise one or more processors or processing cores. For example, the microcontroller(s) 200, 201 may be implemented as one or more microprocessors, microcomputers, digital signal processors, central processing units, logic circuitries, and/or any devices that manipulate signals based on operational instructions. In some cases, the microcontroller(s) 200, 201 may be one or more hardware processors and/or logic circuits of any suitable type specifically programmed or configured to execute the algorithms and processes described herein. The microcontroller(s) 200, 201 can be configured to fetch and execute computer-readable processor-executable instructions stored in a memory.

Such memory, when included, may be an example of tangible non-transitory computer storage media and may include volatile and nonvolatile memory implemented in any type of technology for storage of information such as computer-readable processor-executable instructions, data structures, program modules, or other data. The memory may include, but is not limited to, RAM, ROM, EEPROM, flash memory, solid-state storage, magnetic disk storage, optical storage, and/or other computer-readable media technology. Accordingly, the memory may be computer storage media able to store instructions, programs, or components that may be executed by the processor(s) of the microcontroller(s) 200, 201. Further, when mentioned, non-transitory computer-readable media exclude media such as energy, carrier signals, electromagnetic waves, and signals per se. As mentioned above, in some examples, the microcontroller(s) 200, 201 may include the processor(s) for executing instructions which may be firmware or other executable code stored in the memory. Numerous other variations will be apparent to those of skill in the art having the benefit of the disclosure herein.

The example processes described herein are only examples of processes provided for discussion purposes. Numerous other variations will be apparent to those of skill in the art in light of the disclosure herein. Additionally, while the disclosure herein sets forth several examples of suitable frameworks, architectures and environments for executing the processes, implementations herein are not limited to the particular examples shown and discussed. Furthermore, this disclosure provides various example implementations, as described and as illustrated in the drawings. However, this disclosure is not limited to the implementations described and illustrated herein, but can extend to other implementations, as would be known or as would become known to those skilled in the art.

Various instructions, methods, and techniques described herein may be considered in the general context of computer-executable instructions, such as computer programs and firmware stored on computer-readable media, and executed by the processor(s) and controller(s) herein. Generally, the terms program and firmware may be used interchangeably, and may include instructions, routines, modules, objects, components, data structures, executable code, etc., for performing particular tasks or implementing particular data types. These programs, firmware, and the like, may be executed as native code or may be downloaded and executed. Typically, the functionality of the programs and firmware may be combined or distributed as desired in various implementations. An implementation of these programs, firmware, and the like may be stored on computer storage media or transmitted across some form of communication media.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed:

1. An electronic control unit (ECU) having an internal ground and connected via a first ground path to an external ground and connected via a second ground path to the external ground, the ECU comprising:
 a first load switch circuit including a first transistor and a second transistor connected in a common drain or a common source configuration, the first transistor connected to the first ground path, the second transistor connected to the internal ground via a first resistance, and gates of the first transistor and the second transistor receiving a first voltage;
 a first amplifier having a first input connected between the first transistor and the first ground path and a second input connected between the first resistance and the internal ground;
 a first control circuit including a third transistor, a gate of the third transistor connected to an output of the first sensing amplifier, and the third transistor further connected between the internal ground and the gates of the first transistor and the second transistor; and
 a microcontroller connected to an output of the first sensing amplifier, wherein, when the microcontroller is in an OFF state, the first amplifier is configured to, in response to a ground fault on the first ground path, turn the third transistor to an ON state based on the output of the first amplifier, and the third transistor in the ON state is configured to turn the first transistor and the second transistor to an OFF state; and
 a second amplifier having a first input connected to the internal ground and a second input connected between the second transistor and the first resistance,
 wherein the first control circuit further includes a fourth transistor, a gate of the fourth transistor connected to an output of the microcontroller, and the fourth transistor further connected between the internal ground and the gates of the first transistor and the second transistor,
 wherein, when the microcontroller is in the ON state, the first amplifier is configured to, in response to a ground fault producing an external current above a predetermined level on the first ground path, turn the third transistor to an ON state based on the output of the first amplifier, and the third transistor in the ON state is configured to turn the first transistor and the second transistor to an OFF state, and
 wherein, when the microcontroller is in the ON state, the microcontroller is configured to, in response to a ground fault producing an external current below the predetermined level on the first ground path, turn the fourth transistor to an ON state based at least on an output of the second amplifier, and the fourth transistor in the ON state is configured to turn the first transistor and the second transistor to an OFF state.

2. The ECU according to claim 1, wherein the first transistor and the second transistor in the OFF state are configured to block external current from the first ground path to the internal ground.

3. The ECU according to claim 1, further comprising:
 a first reverse battery protection circuit connected between a first power supply path and the microcontroller,
 wherein the first reverse battery protection includes a fifth transistor and a sixth transistor connected in a common drain or a common source configuration, and a seventh transistor configured to receive a signal to switch the microcontroller from the OFF state to the ON state and to drive gates of the fifth transistor and the sixth transistor,
 the fifth transistor connected to a battery providing a predetermined voltage via the first power supply path,
 the common drain or the common source of the fifth transistor and the sixth transistor configured to generate the first voltage received by the second transistor, and
 the sixth transistor configured to output a second voltage to power the microcontroller in the ON state.

4. The ECU according to claim 3, further comprising:
 a second load switch including a second resistance, a seventh transistor and an eighth transistor connected in a common drain or a common source configuration, the seventh transistor connected to the second ground path, the eighth transistor connected to the internal ground via the second resistance, and gates of the seventh transistor and the eighth transistor receiving a third voltage;

a third amplifier having a first input connected between the seventh transistor and the second ground path and a second input connected between the second resistance and the internal ground;

a second gate control circuit including a ninth transistor, a gate of the ninth transistor connected to an output of the third amplifier, and the ninth transistor further connected between the internal ground and the gates of the seventh transistor and the eighth transistor, wherein, when the microcontroller is in the OFF state, the third amplifier is configured to, in response to a ground fault on the second ground path, turn the ninth transistor to an ON state based on the output of the third amplifier, and the third transistor in the ON state is configured to turn the seventh transistor and the eighth transistor to an OFF state.

5. The ECU according to claim 4, wherein the seventh transistor and the eighth transistor in the OFF state are configured to block external current from the second ground path to the internal ground.

6. The ECU according to claim 4, further comprising:
a fourth amplifier having a first input connected to the internal ground and a second input connected between the eighth transistor and the second resistance; and
a tenth transistor, a gate of the tenth transistor connected to an output of the microcontroller, and the tenth transistor further connected between the internal ground and the gates of the seventh transistor and the eighth transistor,
wherein, when the microcontroller is in the ON state, the third amplifier is configured to, in response to a ground fault producing an external current above a predetermined level on the second ground path, turn the ninth transistor to an ON state based on the output of the third amplifier, and the ninth transistor in the ON state is configured to turn the seventh transistor and the eighth transistor to an OFF state, and
wherein, when the microcontroller is in the ON state, the microcontroller is configured to, in response to a ground fault producing an external current below the predetermined level on the second ground path, turn the tenth transistor to an ON state based at least on an output of the fourth amplifier, and the tenth transistor in the ON state is configured to turn the seventh transistor and the eighth transistor to an OFF state.

7. The ECU according to claim 6, further comprising:
a second reverse battery protection circuit connected between a second power supply path and the microcontroller,
wherein the second reverse battery protection includes an eleventh transistor and a twelfth transistor connected in a common drain or a common source configuration, and a thirteenth transistor configured to receive the signal to switch the microcontroller from the OFF state to the ON state and to drive gates of the eleventh transistor and the twelfth transistor,
the eleventh transistor connected to the battery providing a predetermined voltage via the second power supply path,
the common drain or the common source of the eleventh transistor and the twelfth transistor configured to generate the third voltage received by the eighth transistor, and
the twelfth transistor configured to output a fourth voltage to power the microcontroller in the ON state.

8. The ECU according to claim 7, wherein a first wiring harness connects the battery to the first reverse battery protection circuit to configure the first power supply path, a second wiring harness connects the battery to the second reverse battery protection circuit to configure the second power supply path, a third wiring harness connects the external ground to the first load switch to configure the first ground path, and a fourth wiring harness connects the external ground to the second load switch to configure the second ground path.

9. An electronic control unit (ECU) having an internal ground and connected via a first ground path to an external ground and connected via a second ground path to the external ground, the ECU comprising:
a first load switch circuit configured to connect and disconnect the ECU from the first ground path;
a first amplifier configured to sense current with respect to a first side of the first load switch connected to the first ground path;
a first control circuit configured to drive the first load switch;
a microcontroller, wherein, when the microcontroller is in an OFF state, the first amplifier is configured to sense current corresponding to a ground fault, and, in response to the ground fault, cause the first control circuit to control the first load switch to disconnect the ECU from the first ground path; and
a second amplifier configured to sense current with respect to a second side of the first load switch connected to the internal ground of the ECU,
wherein, when the microcontroller is in an ON state, the first amplifier is configured to sense current above a predetermined level corresponding to a ground fault, and, in response to the ground fault, cause the first control circuit to control the first load switch to disconnect the ECU from the first ground path, and
wherein, when the microcontroller is in an ON state, the second amplifier is configured to sense current below a predetermined level corresponding to a ground fault, and, in response to the ground fault, the microcontroller is configured to cause the first control circuit to control the first load switch to disconnect the ECU from the first ground path.

10. The ECU according to claim 9, wherein the first load switch includes a first pair of transistors connected in a common drain or a common source configuration, the pair of transistors in an OFF state are configured to disconnect the first ground path from the internal ground of the ECU.

11. The ECU according to claim 9, further comprising:
a first reverse battery protection circuit connected between a first power supply path and the microcontroller, and configured to output power to the microcontroller in the ON state.

12. The ECU according to claim 11, further comprising:
a second load switch configured to connect and disconnect the ECU from the second ground path;
a third amplifier configured to sense current with respect to a first side of the second load switch connected to the first ground path;
a second control circuit configured to drive the second load switch, wherein, when the microcontroller is in an OFF state, the third amplifier is configured to sense current corresponding to a ground fault, and, in response to the ground fault, cause the second control circuit to control the second load switch to disconnect the ECU from the second ground path.

13. The ECU according to claim 12, wherein the second load switch includes a second pair of transistors connected in a common drain or a common source configuration, the pair of transistors in an OFF state are configured to disconnect the first ground path from the internal ground of the ECU.

14. The ECU according to claim 12, further comprising:
a fourth amplifier configured to sense current with respect to a second side of the second load switch connected to the internal ground of the ECU,
wherein, when the microcontroller is in an ON state, the third amplifier is configured to sense current above a predetermined level corresponding to a ground fault, and, in response to the ground fault, cause the second control circuit to control the second load switch to disconnect the ECU from the second ground path, and
wherein, when the microcontroller is in an ON state, the fourth amplifier is configured to sense current below a predetermined level corresponding to a ground fault, and, in response to the ground fault, the microcontroller is configured to cause the second control circuit to control the second load switch to disconnect the ECU from the second ground path.

15. The ECU according to claim 14, further comprising:
a second reverse battery protection circuit connected between a second power supply path and the microcontroller, and configured to output power to the microcontroller in the ON state.

16. An electronic control unit (ECU) having an internal ground and connected via a first ground path to an external ground and connected via a second ground path to the external ground, the ECU comprising:
a first load switch circuit configured to connect and disconnect the ECU from the first ground path;
a first amplifier configured to sense current with respect to a first side of the first load switch connected to the first ground path;
a first control circuit configured to drive the first load switch;
a microcontroller, wherein, when the microcontroller is in an OFF state, the first amplifier is configured to sense current corresponding to a ground fault, and, in response to the ground fault, cause the first control circuit to control the first load switch to disconnect the ECU from the first ground path;
a second load switch circuit configured to connect and disconnect the ECU from the second ground path;
a second amplifier configured to sense current with respect to a first side of the second load switch connected to the second ground path;
a second control circuit configured to drive the second load switch; and
a third amplifier configured to sense current with respect to a second side of the first load switch connected to the internal ground of the ECU and a second side of the second load switch connected to the internal ground of the ECU,
wherein, when the microcontroller is in an OFF state, the first amplifier is configured to sense current above a predetermined level corresponding to a ground fault on the first ground path, and, in response to the ground fault on the first ground path, cause the first control circuit to control the first load switch to disconnect the ECU from the first ground path,
wherein, when the microcontroller is in the OFF state, the second amplifier is configured to sense current above the predetermined level corresponding to a ground fault on the second ground path, and, in response to the ground fault on the second ground path, cause the second control circuit to control the second load switch to disconnect the ECU from the second ground path,
wherein, when the microcontroller is in an ON state, the third amplifier is configured to sense current below the predetermined level corresponding to a ground fault on the first ground path, and, in response to the ground fault on the first ground path, the microcontroller is configured to cause the first control circuit to control the first load switch to disconnect the ECU from the first ground path, and
wherein, when the microcontroller is in the ON state, the third amplifier is configured to sense current below the predetermined level corresponding to a ground fault on the second ground path, and, in response to the ground fault on the second ground path, the microcontroller is configured to cause the second control circuit to control the second load switch to disconnect the ECU from the second ground path.

* * * * *